(12) United States Patent
Hamamoto et al.

(10) Patent No.: US 9,348,217 B2
(45) Date of Patent: May 24, 2016

(54) MASK BLANK SUBSTRATE, SUBSTRATE WITH MULTILAYER REFLECTION FILM, TRANSMISSIVE MASK BLANK, REFLECTIVE MASK BLANK, TRANSMISSIVE MASK, REFLECTIVE MASK, AND SEMICONDUCTOR DEVICE FABRICATION METHOD

(71) Applicant: HOYA CORPORATION, Shinjuku-ku, Tokyo (JP)

(72) Inventors: Kazuhiro Hamamoto, Shinjuku-ku (JP); Toshihiko Orihara, Shinjuku-ku (JP); Hirofumi Kozakai, Shinjuku-ku (JP); Youichi Usui, Shinjuku-ku (JP); Tsutomu Shoki, Shinjuku-ku (JP); Junichi Horikawa, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 122 days.

(21) Appl. No.: 14/348,349

(22) PCT Filed: Mar. 28, 2013

(86) PCT No.: PCT/JP2013/059200
§ 371 (c)(1),
(2) Date: Mar. 28, 2014

(87) PCT Pub. No.: WO2013/146991
PCT Pub. Date: Oct. 3, 2013

(65) Prior Publication Data
US 2014/0329174 A1 Nov. 6, 2014

(30) Foreign Application Priority Data

Mar. 30, 2012 (JP) .................................. 2012-079762

(51) Int. Cl.
*G03F 1/50* (2012.01)
*G03F 1/22* (2012.01)
*G03F 1/60* (2012.01)

(52) U.S. Cl.
CPC .. *G03F 1/50* (2013.01); *G03F 1/22* (2013.01); *G03F 1/60* (2013.01)

(58) Field of Classification Search
CPC ........................................................ G06F 1/50
See application file for complete search history.

(56) References Cited

U.S. PATENT DOCUMENTS 5,549,954 A 8/1996 Otsuka et al.
7,470,476 B2 12/2008 Ishii et al.
(Continued)

FOREIGN PATENT DOCUMENTS

| JP | 07-85463 A | 3/1995 |
| JP | 2002-288823 A | 10/2002 |
| JP | 2004-199846 A | 7/2004 |
| JP | 2006-035413 A | 2/2006 |

(Continued)

OTHER PUBLICATIONS

International Search Report of PCT/JP2013/059200 dated Jun. 25, 2013.

*Primary Examiner* — Stephen Rosasco
(74) *Attorney, Agent, or Firm* — Sughrue Mion, PLLC

(57) ABSTRACT

Disclosed is a mask blank substrate for use in lithography, wherein a main surface of the substrate satisfies a relational equation of $(BA_{70}-BA_{30})/(BD_{70}-BD_{30}) \geq 350$ (%/nm), and has a maximum height (Rmax)≤1.2 nm in a relation between a bearing area (%) and a bearing depth (nm) obtained by measuring, with an atomic force microscope, an area of 1 μm×1 μm in the main surface on the side of the substrate where a transfer pattern is formed, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

15 Claims, 6 Drawing Sheets

(56) References Cited

U.S. PATENT DOCUMENTS

2006/0194080 A1 8/2006 Ishii et al.
2011/0109994 A1 5/2011 Kitsunai et al.
2011/0281207 A1* 11/2011 Hosoya ................. B82Y 10/00
430/5

FOREIGN PATENT DOCUMENTS

| JP | 2007-272995 A | 10/2007 |
| JP | 2008-094649 A | 4/2008 |
| JP | 2009-297814 A | 12/2009 |
| WO | 2010/001843 A1 | 1/2010 |

* cited by examiner (a)

(b)

(a)

(b)

(a)

(b)

(a)

(b)

MASK BLANK SUBSTRATE, SUBSTRATE WITH MULTILAYER REFLECTION FILM, TRANSMISSIVE MASK BLANK, REFLECTIVE MASK BLANK, TRANSMISSIVE MASK, REFLECTIVE MASK, AND SEMICONDUCTOR DEVICE FABRICATION METHOD

CROSS REFERENCE TO RELATED APPLICATIONS

This is a National Stage of International Application No. PCT/JP2013/059200 filed Mar. 28, 2013, claiming priority based on Japanese Patent Application No. 2012-079762 filed Mar. 30, 2012, the contents of all of which are incorporated herein by reference in their entirety.

TECHNICAL FIELD

The present invention relates to a mask blank substrate, a substrate with a multilayer reflective film, a transmissive mask blank, a reflective mask blank, a transmissive mask, a reflective mask, and a method of manufacturing a semiconductor device, which ensure suppression of false defects (pseudo defects, nuisance defects) originating from the surface roughness of a substrate and a film in defect inspection using a high-sensitivity defect inspection apparatus, and facilitate the detection of critical defects such as foreign matters and scratches.

BACKGROUND ART

Generally, in the process of manufacturing a semiconductor device, fine patterns are formed using photolithography. A number of transfer masks called photomasks are normally used in forming the fine patterns. This transfer mask is generally a fine pattern formed by a metal thin film or the like and provided on a transparent glass substrate, and photolithography is also used in the fabrication of the transfer mask.

A mask blank having a thin film (e.g., a light shielding film (an opaque film)) for forming a transfer pattern (a mask pattern) on a transparent substrate such as a glass substrate is used in fabricating the transfer mask by photolithography. The fabrication of the transfer mask using the mask blank involves a drawing process of drawing a desired pattern on a resist film formed on the mask blank, a developing process of developing the resist film after drawing to form a desired resist pattern, an etching process of etching the thin film as a mask, and a process of stripping and removing the remaining resist pattern with the resist pattern used as a mask. In the developing process, after the desired pattern is drawn on the resist film formed on the mask blank, a developer is supplied to the resist film to dissolve a portion of the resist film which is soluble in the developer, thereby forming the resist pattern. In the etching step, with the resist pattern used as a mask, an exposed portion of the thin film where the resist pattern is not formed is removed by wet etching or dry etching, thereby forming a desired mask pattern on the transparent substrate. The transfer mask is finished in this way.

A phase shift mask, as well as a binary mask having a light shielding film pattern of a chromium-based material on a conventional transparent substrate, is known as the types of a transfer mask. The phase shift mask is configured to have a phase shift film on a transparent substrate. The phase shift film has a predetermined phase difference, and is made of, for example, a material containing molybdenum silicide compound. Further, a binary mask using a material containing a silicide compound of a metal such as molybdenum for a light shielding film is being used. These binary mask and phase shift mask are generally called a transmissive mask herein, and a binary mask blank and a phase shift mask blank, which are used as a master for a transfer mask, are generally called a transmissive mask blank herein.

In recent years, higher integration of semiconductor devices in the semiconductor industry requires fine patterns beyond the transfer limit of the conventional photolithography using ultraviolet light. To enable formation of such fine patterns, EUV lithography which is an exposure technique using extreme ultraviolet (hereafter referred to as "EUV") is promising. EUV light refers to light in the waveband of the soft X-ray region or the vacuum ultraviolet region, specifically, light with a wavelength of about 0.2 to 100 nm. A reflective mask has been proposed as a transfer mask for use in the EUV lithography. Such a reflective mask has a multilayer reflective film formed on a substrate to reflect exposure light, and an absorber film patterned on the multilayer reflective film to absorb exposure light.

As described above, as a demand for miniaturization in the lithography process increases, problems in the lithography process are becoming prominent. One of the problems concerns defect information on a mask blank substrate or the like, which are used in the lithography process.

The mask blank substrate is demanded to have a higher flatness from the viewpoints of an improvement on the defect quality needed with the recent miniaturization of patterns and the optical characteristics needed for transfer masks. The conventional surface processing methods for mask blank substrates are described in, for example, Patent Literatures 1 to 3.

Patent Literature 1 describes a glass-substrate polishing method of polishing the surface of a glass substrate essentially comprising $SiO_2$ by using a polishing slurry containing colloidal silica with an average primary particle size of 50 nm or less, acid, and water, and adjusted to have a pH of 0.5 to 4, in such a way that the surface roughness, Rms, as measured with an atomic force microscope becomes not more than 0.15 nm.

Patent Literature 2 describes a polishing agent for the synthetic quartz glass substrate, which contains a suppressive colloidal solution and an acidic amino acid to suppress the formation of defects to be detected by a high-sensitivity defect inspection apparatus on the surface of a synthetic quartz glass substrate.

Patent Literature 3 describes a method of controlling the flatness of a quartz glass substrate by placing the quartz glass substrate in a hydrogen radical etching apparatus, and causing hydrogen radicals to act with the quartz glass substrate, so that the flatness can be controlled in the sub-nanometer order.

Patent Literature 1: JP-A-2006-35413
Patent Literature 2: JP-A-2009-297814
Patent Literature 3: JP-A-2008-94649

With the rapid miniaturization of patterns in lithography using an ArF excimer laser or EUV (Extreme Ultra-Violet), the defect sizes of transmissive masks (also called optical masks), such as a binary mask and a phase shift mask, and an EUV mask is a mask are also becoming smaller. To find such fine defects, the wavelength of the inspection light source used in defect inspection is approaching the light source wavelength of the exposure light.

For example, as a defect inspection apparatus for an optical mask, a mask blank, which is a master thereof, and a substrate, high-sensitivity defect inspection apparatuses with an inspection light source wavelength of 193 nm are becoming popular. As a defect inspection apparatus for an EUV mask, an EUV mask blank, which is a master of an EUV mask, and a substrate, high-sensitivity defect inspection apparatuses with inspection light source wavelengths of 266 nm, 193 nm, and 13.5 nm are becoming popular or have been proposed.

The main surface of a substrate used for the conventional transfer mask is managed by surface roughness represented by Rms (root mean square roughness) and Rmax (maximum height) in the fabrication process. Because the detection sensitivity of the high-sensitivity defect inspection apparatus described above is high, however, many false defects are detected in defect inspection of the main surface of the substrate even when the smoothness in compliance with Rms and Rmax becomes higher from the viewpoint of the improvement on the defect quality, raising a problem such that the defect inspection cannot be performed to the end.

The false defect mentioned herein refers to a tolerable irregularity (unevenness) on the substrate surface, which does not affect pattern transfer, and which is erroneously determined as a defect in inspection with a high-sensitivity defect inspection apparatus. When a lot of such false defects are detected in defect inspection, critical defects that affect pattern transfer may be buried in many false defects, so that the critical defects cannot be discovered. For example, a defect inspection apparatus having an inspection light source wavelength of 266 nm or 193 nm, which is currently becoming popular, cannot inspect the presence or absence of critical defects, because over 100,000 false defects are detected. Overlooking critical defects in defect inspection would cause failures in the later mass production process of semiconductor devices, leading to wasteful labor and economical loss.

DISCLOSURE OF THE INVENTION

The present inventors have made intensive studies on such a problem of false defects, and have discovered that management of the bearing curve of the surface roughness and management of the frequency of the bearing depth (%), in addition to the roughness component that has been managed conventionally, can significantly suppress detection of false defects in defect inspection apparatus using a high-sensitivity defect inspection apparatus.

The present invention has been made in consideration of the aforementioned problems, and it is an object of the invention to provide a mask blank substrate, a substrate with a multilayer reflective film, a transmissive mask blank, a reflective mask blank, a transmissive mask, a reflective mask, and a method of manufacturing a semiconductor device, which ensure suppression of false defects originating from the surface roughness of a substrate and a film in defect inspection using a high-sensitivity defect inspection apparatus, and facilitate the detection of critical defects such as foreign matters and scratches.

To achieve the object, a mask blank substrate for use in lithography according to an exemplary embodiment of the invention is configured that, in a relation between a bearing area (%) and a bearing depth (nm) obtained by measuring, with an atomic force microscope, an area of 1 μm×1 μm in a main surface on a side of the substrate where a transfer pattern is formed, the main surface of the substrate satisfies a relational equation of $(BA_{70}-BA_{30})/(BD_{70}-BD_{30})\geq350$ (%/nm), and has a maximum height (Rmax)≤1.2 nm, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

To achieve the object, a substrate with a multilayer reflective film according to an exemplary embodiment of the invention is configured to comprise a multilayer reflective film having a high refractive index layer and a low refractive index layer alternately laminated on the surface of the aforementioned mask blank substrate of the invention.

To achieve the object, a substrate with a multilayer reflective film according to an exemplary embodiment of the invention is a substrate with a multilayer reflective film for use in lithography, the substrate with a multilayer reflective film being configured to comprise a multilayer reflective film having a high refractive index layer and a low refractive index layer alternately laminated on a main surface of a mask blank substrate, wherein a surface of the multilayer reflective film satisfies a relational equation of $(BA_{70}-BA_{30})/(BD_{70}-BD_{30})\geq230$ (%/nm), and has a maximum height (Rmax)≤1.5 nm in a relation between a bearing area (%) and a bearing depth (nm) obtained by measuring, with an atomic force microscope, an area of 1 μm×1 μm in the surface of the multilayer reflective film, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

To achieve the object, a transmissive mask blank according to an exemplary embodiment of the invention is configured to comprise a light shielding function film to be a transfer pattern on the main surface of the aforementioned mask blank substrate of the invention.

To achieve the object, a reflective mask blank according to an exemplary embodiment of the invention is configured to comprise an absorber film to be a transfer pattern on the multilayer reflective film or the protective film of the aforementioned substrate with a multilayer reflective film of the invention.

To achieve the object, a transmissive mask according to an exemplary embodiment of the invention is configured to comprise a light shielding function film pattern provided on the main surface by patterning the light shielding function film of the aforementioned transmissive mask blank of the invention.

To achieve the object, a reflective mask according to an exemplary embodiment of the invention is configured to comprise an absorber pattern provided on the multilayer reflective film by patterning the absorber film of the aforementioned reflective mask blank of the invention.

To achieve the object, a method of manufacturing a semiconductor device according to an exemplary embodiment of the invention is configured to comprise a step of forming a transfer pattern on a transferred substrate using the aforementioned transmissive mask of the invention by performing a lithography process using an exposure device.

To achieve the object, a method of manufacturing a semiconductor device according to an exemplary embodiment of the invention is configured to comprise a step of forming a transfer pattern on a transferred substrate using the aforementioned reflective mask of the invention by performing a lithography process using an exposure device.

DETAILED DESCRIPTION OF THE INVENTION

General Description

Figure 1:
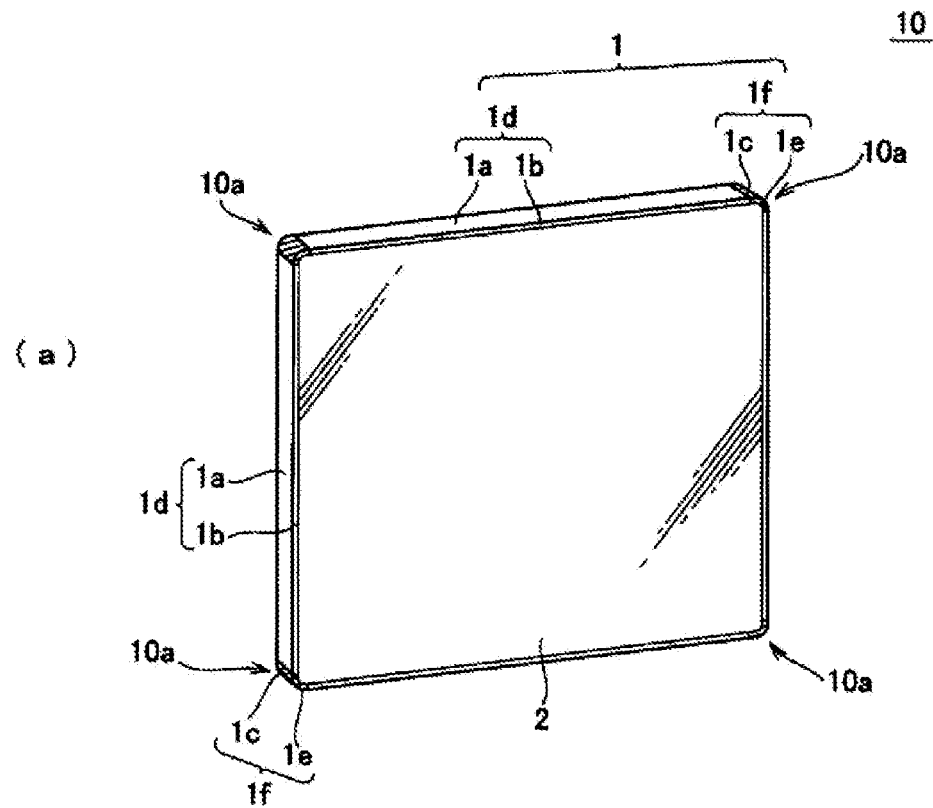
FIG. 1(a) is a perspective view illustrating a mask blank substrate 10 according to an exemplary embodiment of the present invention.
FIG. 1(b) is a schematic cross-sectional view illustrating the mask blank substrate 10 of the present embodiment.
Figure 1:
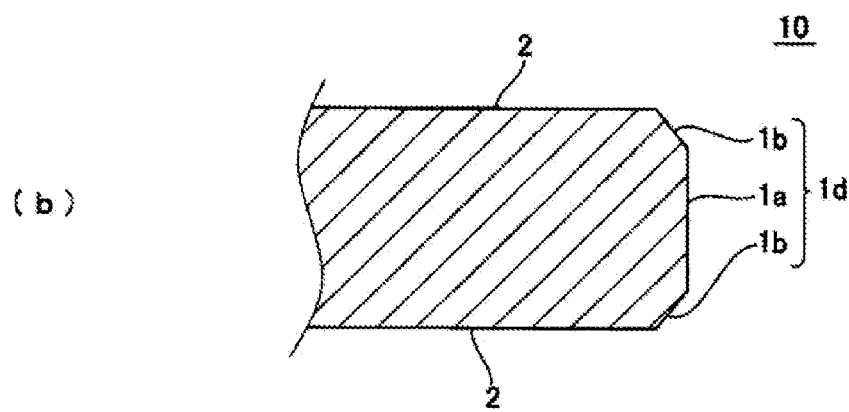

To achieve the above-described object, the present inventions are the following configurations.

(First Configuration)

A first configuration of the present invention is a mask blank substrate for use in lithography, a main surface of the substrate satisfying a relational equation of $(BA_{70}-BA_{30})/(BD_{70}-BD_{30}) \geq 350$ (%/nm), and having a maximum height $(Rmax) \leq 1.2$ nm in a relation between a bearing area (%) and a bearing depth (nm) obtained by measuring, with an atomic force microscope, an area of 1 μm×1 μm in the main surface on the side of the substrate where a transfer pattern is formed, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

According to the first configuration, the irregularities (surface roughness) forming the main surface become highly aligned surface states while maintaining a very high smoothness, thus reducing a variation in irregularities (surface roughness) that lead to detection of false defects in defect inspection. This makes it possible to suppress detection of false defects in the defect inspection using a high-sensitivity defect inspection apparatus, thereby making the critical defects more noticeable.

(Second Configuration)

A second configuration of the invention is a mask blank substrate according to the first configuration, wherein the main surface is a surface such that, in the frequency distribution plotting the relation between the bearing depth, measured with the atomic force microscope, and the frequency (%) of the obtained bearing depth, the absolute value of the bearing depth corresponding to the center of a half-value width obtained from an approximation curve obtained by the plotted points or the highest frequency at the plotted points is smaller than the absolute value of the bearing depth corresponding to ½ of a maximum height (Rmax) of the surface roughness of the main surface of the substrate.

According to the second configuration, irregularities forming the main surface of the substrate become surface states such that the ratio of concave portions to a reference surface is greater than the ratio of convex portions thereto. When a plurality of thin films are laminated on the main surface, the size of defects on the main surface tend to become smaller, which is preferable from the viewpoint of the defect quality. Particularly, the effect is demonstrated when a multilayer reflective film to be described later is formed on the main surface.

(Third Configuration)

A third configuration of the invention is a mask blank substrate according to the first configuration or the second configuration, wherein the main surface is subjected to a surface treatment with catalyst-referred etching.

According to the third configuration, because the main surface is selectively subjected to a surface treatment from convex portions contacting the surface of the catalyst which is a reference surface by catalyst-referred etching, irregularities (surface roughness) forming the main surface become highly aligned surface states while being kept very smooth, and become such surface states that the ratio of concave portions is greater than the ratio of convex portions with respect to the reference surface. When a plurality of thin films are laminated on the main surface, the size of defects on the main surface tend to become smaller, which is preferable from the viewpoint of the defect quality. Particularly, the effect is demonstrated when a multilayer reflective film to be described later is formed on the main surface. Further, execution of a surface treatment to the main surface by catalyst-referred etching as mentioned above makes it possible to relatively easily form the surface with the surface roughness and the bearing curve characteristics as defined in the first or second configuration.

(Fourth Configuration)

A fourth configuration of the invention is a mask blank substrate according to any one of the first to third configurations, wherein the mask blank substrate is used in EUV lithography.

According to the fourth configuration, the substrate is a mask blank substrate for use in EUV lithography, whereby the surface state of the multilayer reflective film formed on the main surface becomes very smooth, so that the reflectance characteristics to EUV light become better.

(Fifth Configuration)

A fifth configuration of the invention is a mask blank substrate according to the fourth configuration, wherein a thin film of a material comprising a metal, an alloy, or at least one of oxygen, nitrogen and carbon contained in one of the metal and the alloy, is formed on the main surface of a substrate of a multi-element glass material.

Generally, since a mask blank substrate for use in EUV lithography needs the characteristics of low thermal expansion, so that it is preferred to use a multi-element glass material to be described later. The multi-element glass material has a property such that high smoothness is difficult to obtain compared to synthetic quartz glass. Accordingly, a thin film of a material comprising a metal, an alloy, or at least one of oxygen, nitrogen and carbon contained in one of the metal and the alloy is formed on the main surface of the substrate comprising a multi-element glass material. A substrate having the surface state as defined by the first or second configuration is easily obtained by performing a surface treatment to the surface of such a thin film.

(Sixth Configuration)

A sixth configuration of the invention is a substrate with a multilayer reflective film comprising a multilayer reflective film having a high refractive index layer and a low refractive index layer alternately laminated on the surface of the mask blank substrate according to any one of the first to fifth configurations.

According to the sixth configuration, the surface state of the multilayer reflective film formed on the main surface becomes very smooth, so that the reflectance characteristics to EUV light become better. Further, it is possible to sufficiently suppress detection of false defects in the defect inspection of the surface of the multilayer reflective film using a high-sensitivity defect inspection apparatus, and further make the critical defects more noticeable.

(Seventh Configuration)

A seventh configuration of the invention is a substrate with a multilayer reflective film for use in lithography, the substrate with a multilayer reflective film being configured to comprise a multilayer reflective film having a high refractive index layer and a low refractive index layer alternately laminated on a main surface of a mask blank substrate, wherein a surface of the multilayer reflective film satisfies a relational equation of $(BA_{70}-BA_{30})/(BD_{70}-BD_{30}) \geq 230$ (%/nm), and has a maximum height (Rmax)$\leq$1.5 nm in a relation between a bearing area (%) and a bearing depth (nm) obtained by measuring, with an atomic force microscope, an area of 1 μm×1 μm in the surface of the multilayer reflective film, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

According to the seventh configuration, the irregularities (surface roughness) forming the surface of the multilayer reflective film become highly aligned surface states while maintaining a very high smoothness, thus reducing a variation in irregularities (surface roughness) that lead to detection of false defects in defect inspection. This makes it possible to suppress detection of false defects in the defect inspection using a high-sensitivity defect inspection apparatus, thereby making the critical defects more noticeable.

(Eighth Configuration)

An eighth configuration of the invention is a substrate with a multilayer reflective film according to the sixth or seventh configuration, wherein the substrate with a multilayer reflective film has a protective film on the multilayer reflective film.

According to the eighth configuration, the substrate with a multilayer reflective film is configured to have the protective film on the multilayer reflective film to suppress damages to the multilayer reflective film at the time of fabricating a transfer mask (EUV mask), so that the reflectance characteristics to EUV light become better. In addition, it is possible to sufficiently suppress detection of false defects in the defect inspection of the surface of the protective film using a high-sensitivity defect inspection apparatus, and further make the critical defects more noticeable.

(Ninth Configuration)

A ninth configuration of the invention is a transmissive mask blank comprising a light shielding function film to be a transfer pattern on the main surface of the mask blank substrate according to any one of the first to third configurations.

According to the ninth configuration, the irregularities (surface roughness) forming the surface of the light shielding function film in the transmissive mask blank become highly aligned surface states while maintaining a very high smoothness, thus reducing a variation in irregularities (surface roughness) that lead to detection of false defects in defect inspection. This makes it possible to suppress detection of false defects in the defect inspection using a high-sensitivity defect inspection apparatus, thereby making the critical defects more noticeable.

(Tenth Configuration)

A tenth configuration of the invention is a reflective mask blank comprising an absorber film to be a transfer pattern on the multilayer reflective film or the protective film of the substrate with a multilayer reflective film according to the seventh or eighth configuration.

According to the tenth configuration, the irregularities (surface roughness) forming the surface of the absorber film in the reflective mask blank become highly aligned surface states while maintaining a very high smoothness, thus reducing a variation in irregularities (surface roughness) that lead to detection of false defects in defect inspection. This makes it possible to suppress detection of false defects in the defect inspection using a high-sensitivity defect inspection apparatus, thereby making the critical defects more noticeable.

(Eleventh Configuration)

An eleventh configuration of the invention is a transmissive mask comprising a light shielding function film pattern provided on the main surface by patterning the light shielding function film of the transmissive mask blank according to the ninth configuration.

(Twelfth Configuration)

A twelfth configuration of the invention is a reflective mask comprising an absorber pattern provided on the multilayer reflective film by patterning the absorber film of the reflective mask blank according to the tenth configuration.

According to the eleventh and twelfth configurations, it is possible to suppress detection of false defects in the defect inspection on the transmissive mask and the reflective mask using a high-sensitivity defect inspection apparatus, making the critical defects more noticeable.

(Thirteenth Configuration)

A thirteenth configuration of the invention is a method of manufacturing a semiconductor device, comprising a step of forming a transfer pattern on a transferred substrate using the transmissive mask according to the eleventh configuration by performing a lithography process using an exposure device.

(Fourteenth Configuration)

A fourteenth configuration of the invention is a method of manufacturing a semiconductor device, comprising a step of forming a transfer pattern on a transferred substrate using the reflective mask according to the twelfth configuration by performing a lithography process using an exposure device.

According to the thirteenth and fourteenth configurations, a transmissive mask or a reflective mask from which critical defects such as a foreign matter or scratches is removed can be used in defect inspection using a high-sensitivity defect inspection apparatus, so that a transfer pattern such as a circuit pattern to be transferred onto a resist film formed on a target body such as a semiconductor substrate is free of defects. This makes it possible to manufacture a semiconductor device having a fine and high-precision transfer pattern.

Effects of the Invention

The mask blank substrate, a substrate with a multilayer reflective film, the transmissive mask blank, the reflective mask blank, the transmissive mask and the reflective mask according to the invention permit detection of false defects originating from the surface roughness of a substrate and a film to be suppressed in defect inspection using a high-sensitivity defect inspection apparatus, and facilitate the detection of critical defects such as foreign matters and scratches. In the mask blank substrate, the substrate with a multilayer reflective film, the reflective mask blank and the reflective mask for use in EUV lithography, in particular, the multilayer reflective film formed on the main surface of the substrate provides high reflectance while suppressing false defects.

According to the above-described method of manufacturing a semiconductor device, a reflective mask or a transmissive mask from which critical defects such as a foreign matter or scratches is removed can be used in defect inspection using a high-sensitivity defect inspection apparatus, so that a transfer pattern such as a circuit pattern to be transferred on a resist film formed on a transferred substrate such as a semiconductor substrate is free of defects. This makes it possible to manufacture a semiconductor device having a fine and high-precision circuit pattern.

DESCRIPTION OF ILLUSTRATED EMBODIMENTS

Mask Blank Substrate

A mask blank substrate according to the present invention is described as follows.

FIG. 1(a) is a perspective view illustrating a mask blank substrate 10 according to an exemplary embodiment of the present invention. FIG. 1(b) is a schematic cross-sectional view illustrating the mask blank substrate 10 of this embodiment.

A mask blank substrate 10 (or simply referred to as substrate 10) is a rectangular plate-like body, and includes two opposite main surfaces 2 and end faces 1. The two opposite main surfaces 2 are an upper surface and a lower surface of the plate-like body, and are formed so as to face each other. At least one of the two opposite main surfaces 2 is the main surface where a transfer pattern is formed.

The end faces 1 are side surfaces of the plate-like body, and are adjacent to the outer edges of the opposite main surfaces 2. The end face 1 has a flat end face portion 1d and a curved end face portion 1f. The flat end face portion 1d is a surface connecting the side of one opposite main surface 2 and the side of the other opposite main surface 2, and includes a side surface portion 1a and a chamfered inclined surface portion 1b. The side surface portion 1a is that portion (T side) in the flat end face portion 1d which is substantially perpendicular to the opposing main surfaces 2. The chamfered inclined surface portion 1b is a chamfered portion (C side) between the side surface portion 1a and the opposite main surface 2, and is formed between the side surface portion 1a and the opposite main surface 2.

The curved end portions 1f is a portion (R portion) adjacent to the vicinity of a corner portion 10a of the substrate 10 in a plan view of the substrate 10, and includes a side surface portion 1c and a chamfered inclined portion 1e. The plan view of the substrate 10 is, for example, is to see the substrate 10 from a direction perpendicular to the opposite main surface 2. Further, the corner portion 10a of the substrate 10 is, for example, the vicinity of the intersection of the two sides at the outer edge of the opposite main surface 2. The intersection of the two sides may be the intersection of the extensions of the two sides. In this embodiment, the curved end portion 1f is formed into a curved shape by rounding the corner portion 10a of the substrate 10.

To achieve the above object, this embodiment is characterized in that at least the main surface on which a transfer pattern is formed, that is, the main surface on that side of a transmissive mask blank 50 where a light shielding function film 51 is formed, or the main surface on that side of a reflective mask blank 30 where a multilayer reflective film 21, a protective film 22, and an absorber film 24 are formed, as described later, has a certain surface roughness and bearing curve characteristics satisfying a certain relational expression.

The relation between the surface roughnesses (Rmax, Rms), which are parameters representing the surface states of the main surfaces of the mask blank substrate 10 of this embodiment, and the bearing curve, is described as follows.

First, Rms (Root Means Square), which is a representative index of the surface roughness, is the root mean square roughness that is the square root of the mean value of the square of the deviation from an average line to a measurement curve. Rms is expressed by the following equation (1).

[Eq. 1]

$$\text{Rms} = \sqrt{\frac{1}{l}\int_0^l Z^2(x)\,dx} \quad (1)$$

In the equation (1), 1 is a reference length, and Z is the height from the average line to the measurement curve.

Rmax, which is likewise a representative index of the surface roughness, is the height of the maximum surface roughness, Rmax is the maximum height of the surface roughness or the difference between the absolute value of the maximum value of the height of the crest of the roughness curve and the absolute value of the maximum value of the depth of the trough of the roughness curve.

Rms and Rmax have been used to manage the surface roughness of the mask blank substrate, and are excellent in that the surface roughness can be grasped by a numeral. However, Rms and Rmax are both height information and do not include information about a change in a fine surface shape.

By contrast, the bearing curve is a plot of the ratios of sectional areas obtained by cutting irregularities in a measuring area on the main surface of the substrate 10 at a constant-height surface (horizontal plane). The bearing curve can provide visualization and quantification of a variation in the surface roughness of the substrate 10.

The bearing curve is generally plotted to have a bearing area (%) on the ordinate and a bearing depth (nm) on the abscissa. A bearing area of 0(%) represents a maximum point of a reference surface to be measured, and a bearing area of 100(%) represents a minimum point of the reference surface to be measured. Therefore, the difference between the depth of the bearing area of 0(%) and the depth of the bearing area of 100(%) becomes the aforementioned maximum height (Rmax). The "bearing depth" referred to in the invention is equivalent to "bearing height." In the case of "bearing height," on the other hand, the bearing area of 0(%) represents a minimum point of a reference surface to be measured, and the bearing area of 100(%) represents a maximum point of the reference surface to be measured. Management of the bearing curve for the mask blank substrate 10 according to this embodiment is described as follows.

To achieve the aforementioned object, the mask blank substrate 10 according to this embodiment is configured so that a main surface of the substrate satisfies a relational equation of $(BA_{70}-BA_{30})/(BD_{70}-BD_{30}) \geq 350$ (%/nm), and has a maximum height (Rmax)≤1.2 nm in a relation between a bearing area (%) and a bearing depth (nm) obtained by measuring, with an atomic force microscope, an area of 1 μm×1 μm in the main surface on the side of the substrate where a transfer pattern is formed, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

In other words, $(BA_{70}-BA_{30})/(BD_{70}-BD_{30})$ (unit: %/nm) mentioned above represents the inclination of the bearing curve for the bearing areas of 30% to 70%, and setting the inclination to 350 (%/nm) allows the bearing area to reach 100% at a shallower bearing depth (nm). That is, the irregularities (surface roughness) forming the main surface of the substrate 10 become highly aligned surface states while maintaining a very high smoothness, thus reducing a variation in irregularities (surface roughness) that lead to detection of false defects in defect inspection. This makes it possible to suppress detection of false defects in the defect inspection using a high-sensitivity defect inspection apparatus, thereby making the critical defects more noticeable.

It is desirable that from the viewpoint of suppressing detection of false defects, the main surface of the substrate 10 should be formed in such a way that the irregularities (surface roughness) forming the main surface become highly aligned surface states, preferably, $(BA_{70}-BA_{30})/(BD_{70}-BD_{30}) \geq 400$ (%/nm), more preferably, $(BA_{70}-BA_{30})/(BD_{70}-BD_{30}) \geq 450$ (%/nm), more preferably $(BA_{70}-BA_{30})/(BD_{70}-BD_{30}) \geq 500$ (%/nm), more preferably, $(BA_{70}-BA_{30})/(BD_{70}-BD_{30}) \geq 750$ (%/nm), more preferably, $(BA_{70}-BA_{30})/(BD_{70}-BD_{30}) \geq 800$ (%/nm), and more preferably, $(BA_{70}-BA_{30})/(BD_{70}-BD_{30}) \geq 900$ (%/nm). In addition, from a similar viewpoint, the surface roughness of the substrate 10 should also have high smoothness, and it is desirable that preferably, maximum height (Rmax)≤1.1 nm, more preferably, maximum height (Rmax)≤1.0 nm, more preferably, maximum height (Rmax) ≤0.75 nm, and more preferably, maximum height (Rmax) ≤0.5 nm.

Further, it is preferable that the surface roughness of the main surface of the substrate 10 should be managed by the root mean square roughness (Rms) in addition to the aforementioned maximum height (Rmax) from the viewpoint of improving the optical characteristics such as the reflectances of the multilayer reflective film, the protective film, absorber film, and light shielding function film which are formed on the main surface of the substrate 10. It is desirable that the surface roughness of the main surface of the substrate 10 should preferably be root mean square roughness (Rms) ≤0.12 nm, more preferably, root mean square roughness (Rms)≤0.10 nm, more preferably, root mean square roughness (Rms)≤0.08 nm, and more preferably, root mean square roughness (Rms)≤0.05 nm.

It is preferable that the main surface of the substrate 10 is a surface state such that, in the frequency distribution plotting the relation between the bearing depth, measured with the atomic force microscope, and the frequency (%) of the obtained bearing depth, the absolute value of the bearing depth corresponding to the center of a half-value width obtained from an approximation curve obtained by the plotted points or the highest frequency at the plotted points is smaller than the absolute value of the bearing depth corresponding to ½ of a maximum height (Rmax) of the surface roughness of the main surface of the substrate. This surface state is a surface state such that the ratio of concave portions to a reference surface is greater than the ratio of convex portions thereto. Therefore, when a plurality of thin films are laminated on the main surface, the size of defects on the main surface tend to become smaller, which is preferable from the viewpoint of the defect quality. Particularly, the effect is demonstrated when a multilayer reflective film to be described later is formed on the main surface.

Further, it is preferable that the main surface of the substrate 10 should be a surface treated by catalyst-referred etching. CAtalyst-Referred etching (hereinafter also referred to as CARE) is a surface treatment method selectively removing fine convex portions present on the main surface to smooth the main surface by active species generated from the molecules of the treatment liquid which are adsorbed to the catalyst, by making the main surface of the substrate 10 and the catalyst to move closer or come in contact with each other while a treatment fluid that do not exhibit solubility in a normal state is interposed between the main surface of the substrate 10 and the catalyst.

According to the fourth configuration, because the main surface of the substrate 10 is selectively subjected to a surface treatment from convex portions contacting the surface of the catalyst which is a reference surface by catalyst-referred etching, irregularities (surface roughness) forming the main surface become highly aligned surface states while being kept very smooth, and become such surface states that the ratio of concave portions is greater than the ratio of convex portions with respect to the reference surface. When a plurality of thin films are laminated on the main surface, the size of defects on the main surface tend to become smaller, which is preferable from the viewpoint of the defect quality. Particularly, the effect is demonstrated when a multilayer reflective film to be described later is formed on the main surface. Further, execution of a surface treatment to the main surface by catalyst-referred etching as mentioned above makes it possible to relatively easily form the surface with the surface roughness and the bearing curve characteristics as defined in the first or second configuration.

When the material for the substrate 10 is a glass material, at least one material selected from the group of platinum, gold, a transition metal, and an alloy comprising at least one thereof may be available as the catalyst. Further, at least one solution selected from the group of functional water such as pure water, ozone water or hydrogen water, a low-concentration alkaline aqueous solution, and a low-concentration acidic aqueous solution may be available as the treatment solution.

With the surface roughness of the main surface of the substrate and the bearing curve characteristics being set in the above-described ranges as described above, it is possible to significantly suppress detection of false defects in defect inspection with a high-sensitivity defect inspection apparatus using inspection light having a wavelength region of 150 nm to 365 nm or a high-sensitivity defect inspection apparatus using inspection light (EUV light) having a wavelength region of 0.2 nm to 100 nm, for example, the mask substrate/blank defect inspection apparatus "MAGICS M7360" for EUV exposure of Lasertec Corp. (inspection light source wavelength: 266 nm), the reticle, the optical mask/blank and the EUV mask/blank defect inspection apparatus "Teron 600 series" of KLA-Tencor Corp. (inspection light source wavelength: 193 nm) and in a defect inspection apparatus using EUV light for an inspection light source (inspection light source wavelength: 13.5 nm).

It is noted that the inspection light source wavelength is not limited to 266 nm, 193 nm, and 13.5 nm. 532 nm, 488 nm, 364 nm, and 257 nm may be used as the inspection light source wavelength.

The mask blank substrates to be subjected to defect inspection using a high-sensitivity defect inspection apparatus with the inspection light source wavelength include a transmissive mask blank substrate, and a reflective mask blank substrate.

It is preferable that the main surface of the mask blank substrate 10 according to this embodiment on which a transfer pattern is formed should be treated to have a high flatness at least from the viewpoint of obtaining the pattern transfer accuracy and position precision. For an EUV reflective mask blank substrate, it is preferable that the flatness of an area of 132 mm×132 mm or an area of 142 mm×142 mm of the main surface of the substrate 10 on which a transfer pattern is formed should be not more than 0.1 μm, particularly preferably, not more than 0.05 μm. Further, the main surface opposite to the main surface of the substrate 10 on which a transfer pattern is formed is a surface that is electrostatically chucked when the substrate 10 is set in the exposure apparatus, the flatness of an area of 142 mm×142 mm is not more than 1 μm, particularly preferably, not more than 0.5 μm. For the mask blank substrate 10 to be used for a transmissive mask blank for exposure by an ArF excimer laser, the flatness of an area of 132 mm×132 mm or an area of 142 mm×142 mm of the main surface of the substrate 10 on which a transfer pattern is formed should be not more than 0.3 μm, particularly preferably, not more than 0.2 μm.

Any material transparent to the exposure wavelength is available as a material for a transmissive mask blank substrate for exposure by an ArF excimer laser. In general, synthetic quartz glass is used. Other available materials may be aluminosilicate glass, soda-lime glass, borosilicate glass, and non-alkali glass.

Any material having a low thermal expansion property is available as a material for a reflective mask blank substrate for EUV exposure. For example, a $SiO_2$—$TiO_2$ glass (2-element based ($SiO_2$—$TiO_2$) and 3-element based ($SiO_2$—$TiO_2$—$SnO_2$ or the like)), e.g., what is called multi-element glass such as $SiO_2$—$Al_2O_3$—$Li_2O$ based crystallized glass is available. In addition, a substrate of silicon or metal in addition to a glass substrate may be used. Examples of the metal substrate include an Invar alloy (Fe—Ni-based alloy).

As described above, because the mask blank substrate for EUV exposure needs low thermal expansion characteristics, is required in the substrate, a multi-element glass material is used; however, this material undesirably has a difficulty in obtaining high smoothness as compared with synthetic silica glass. To solve this problem, a thin film made of a metal, an alloy or a material containing at least one of oxygen, nitrogen, carbon contained in either the metal or the alloy is formed on a substrate made of a multi-element glass material. Then, the surface of such a thin film is subjected to mirror polishing and a surface treatment, making it possible to relatively easily form a surface with the surface roughness and the bearing curve characteristics in the aforementioned ranges.

As the material for the thin film, for example, Ta (tantalum), an alloy containing Ta or a Ta compound containing at least one of oxygen, nitrogen, carbon contained in either the metal or the alloy is preferable. As the Ta compound, for example, TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON and the like may be used. Of these Ta compounds, TaN, TaON, TaCON, TaBN, TaBON, TaBCON, TaHfN, TaHfON, TaHfCON, TaSiN, TaSiON, and TaSiCON containing nitrogen (N) are more preferable. It is desirable that in view of the high smoothness of the surface of the thin film, the thin film should have an amorphous structure. The crystal structure of the thin film can be measured by X-ray diffractometer (XRD).

The processing method for obtaining the surface roughness and bearing curve characteristics as specified above is not particularly limited in the invention. The invention is characterized in that the bearing curve and the frequency of the bearing depth at the surface roughness of the mask blank substrate are managed, and such a surface roughness may be achieved by, for example, processing methods illustrated in Examples 1 to 3 to be described later.

[Substrate with a Multilayer Reflective Film]

The substrate with a multilayer reflective film 20 according to an exemplary embodiment of the invention is described as follows.

Figure 2:
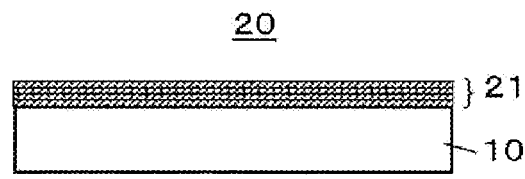
FIG. 2 is a schematic cross-sectional view illustrating an example of the configuration of a substrate with a multilayer reflective film according to an exemplary embodiment of the present invention.

FIG. 2 is a schematic diagram illustrating a substrate with a multilayer reflective film 20 according to this embodiment.

The substrate with a multilayer reflective film 20 according to the embodiment is configured to have the multilayer reflective film 21 provided on the main surface of the above-described mask blank substrate 10 where a transfer pattern is formed. This multilayer reflective film 21 provides a reflective mask for EUV lithography with the capability of reflecting EUV light, and has a structure of a multilayer reflective film having elements of different reflectances laminated periodically.

The material for the multilayer reflective film 21 is not particularly limited as long as it reflects EUV light; the reflective multilayer film 21 generally has a reflectance of 65% alone, and has an upper reflectance limit of 73%. In general, such a multilayer reflective film 21 may have thin films made of a material with a high refractive index (high refractive index layers) and thin films made of a material with a low refractive index (low refractive index layers) alternately laminated by about 40 to 60 periods.

For example, it is preferable that the multilayer reflective film 21 for EUV light with a wavelength of 13 nm to 14 nm is a Mo/Si periodic multilayer film having Si films and Mo films alternately laminated by about 40 periods. As other multilayer reflective films for use in the region of EUV light, a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, and a Si/Ru/Mo/Ru periodic multilayer film are available.

The methods of forming the multilayer reflective film 21 are known in the art; for example, the multilayer reflective film 21 may be formed by depositing individual layers by magnetron sputtering, ion beam sputtering or the like. For the aforementioned Mo/Si periodic multilayer film, for example, the multilayer reflective film 21 is formed by ion beam sputtering to deposit a film with a thickness of about several nanometers on the substrate 10 using a Si target first, then deposit a Mo film with a thickness of about several nanometers using a Mo target, as one period, and then laminate those two films by 40 to 60 periods.

To protect the multilayer reflective film 21 from dry etching or wet cleaning in the process of manufacturing a reflective mask for EUV lithography, the protective film 22 (see FIG. 3) may be formed on the multilayer reflective film 1 formed as described above. The structure with the multilayer reflective film 21 and the protective film 22 on the mask blank substrate 10 may be included in the substrate with a multilayer reflective film according to invention.

As the material for the protective film 22, for example, materials such as Ru, Ru—(Nb, Zr, Y, B, Ti, La, Mo), Si—

(Ru, Rh, Cr, B), Si, Zr, Nb, La and B can be used. Of the materials, if those containing ruthenium (Ru) applied, reflectance characteristics of the multilayer reflective film become better. Specifically, Ru and Ru—(Nb, Zr, Y, B, Ti, La, Mo) are preferred. Such a protective film is particularly effective when the absorber film is formed of a Ta-based material and is patterned by dry etching with Cl-based gas.

It is preferable that the surface of the multilayer reflective film 21 or the protective film 22 of the substrate with a multilayer reflective film 20 should satisfy a relational equation of $(BA_{70}-BA_{30})/(BD_{70}-BD_{30}) \geq 230$ (%/nm), and have a maximum height (Rmax)≤1.5 nm in a relation between a bearing area (%) and a bearing depth (nm) obtained by measuring, with an atomic force microscope, an area of 1 μm×1 μm in the surface of the multilayer reflective film, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%. This configuration makes it possible to significantly suppress detection of false defects in performing defect inspection of the substrate with a multilayer reflective film 20 with a high-sensitivity defect inspection apparatus using the aforementioned inspection light source wavelength. Further, there also is an effect of obtaining a high reflectance resulting from the improvement on the smoothness of the surface of the multilayer reflective film 21 or the protective film 22 to make the surface roughness (Rmax) smaller.

It is desirable that the surface of the multilayer reflective film 21 or the protective film 22 should preferably satisfy $(BA_{70}-BA_{30})/(BD_{70}-BD_{30}) \geq 250$ (%/nm), more preferably, $(BA_{70}-BA_{30})/(BD_{70}-BD_{30}) \geq 300$ (%/nm), more preferably $(BA_{70}-BA_{30})/(BD_{70}-BD_{30}) \geq 350$ (%/nm), more preferably, $(BA_{70}-BA_{30})/(BD_{70}-BD_{30}) \geq 400$ (%/nm), more preferably, $(BA_{70}-BA_{30})/(BD_{70}-BD_{30}) \geq 450$ (%/nm), and more preferably, $(BA_{70}-BA_{30})/(BD_{70}-BD_{30}) \geq 500$ (%/nm). In addition, from a similar viewpoint, it is desirable that the surface roughness of the multilayer reflective film or the protective film should preferably be set to maximum height (Rmax)≤1.3 nm, more preferably, maximum height (Rmax)≤1.2 nm, more preferably, maximum height (Rmax)≤1.1 nm, and more preferably, maximum height (Rmax)≤1.0 nm.

To permit the surface of the multilayer reflective film 21 or the protective film 22 to have the surface roughness and the bearing curve characteristics in the aforementioned ranges while maintaining the surface state of the main surface of the substrate 10 in the aforementioned range, the multilayer reflective film 21 is deposited by obliquely depositing a high refractive index layer and a low refractive index layer with respect to the normal line of the main surface of the substrate 10. More specifically, to permit the surface of the multilayer reflective film 21 or the protective film 22 to have the surface roughness and the bearing curve characteristics in the aforementioned ranges and to provide good reflectance characteristics of the multilayer reflective film 12 and the protective film 13, deposition is performed by ion beam sputtering in such a way that the incident angle of sputtered particles for deposition of low refractive index layers constituting the multilayer reflective film 21 becomes greater than the incident angle of sputtered particles for deposition of high refractive index layers with respect to the normal line of the main surface of the substrate 10. In further details, the incident angle of sputtered particles for deposition of low refractive index layers of Mo or the like should be not less than 40 degrees and less than 90 degrees, and the incident angle of sputtered particles for the deposition of high refractive index layer of Si or the like should be not less than 0 degrees and not more than 60 degrees. To improve the surface states of the main surfaces of the 10 so that the surface of the multilayer reflective film 21 or the protective film 22 has the surface roughness and the bearing curve characteristics in the aforementioned ranges, deposition should be performed in such a way that the incident angles of sputtered particles for deposition of the low refractive index layers and high refractive index layers which constitute the multilayer reflective film 21 are not less than 0 degrees and not more than 30 degrees. Furthermore, the protective film 22 that is formed on the multilayer reflective film 21 is consecutively formed after deposition of the multilayer reflective film 21 in such a way that the protective film 22 is deposited obliquely with respect to the normal line of the main surface of the substrate 10.

A back-side conductive film 23 (see FIG. 3) may be formed on that side of the substrate with a multilayer reflective film 20 which is opposite to the side contacting the multilayer reflective film 21 of the substrate 10 for the purpose of electrostatic chuck. The structure with the multilayer reflective film 21 and the protective film 22 on that side of the mask blank substrate 10 where a transfer pattern is formed, and the back-side conductive film 23 is provided on that side which is opposite to the side contacting the multilayer reflective film 21 may be included in the substrate with a multilayer reflective film 20 according to invention. The electrical properties (sheet resistance) required for the back-surface conductive film 23 are typically not more than 100Ω/□. The method of forming the back-side conductive film 23 is known; for example, the back-side conductive film 23 may be formed by magnetron sputtering or ion beam sputtering method by using a target of metal or an alloy of Cr, Ta or the like.

As the substrate with a multilayer reflective film 20 according to the embodiment, a base layer (an under layer) may be formed between the substrate 10 and the multilayer reflective film 21. The base layer may be formed for the purposes of improving smoothness of the main surface of the substrate 10, reducing defects, increasing the reflectance of the multilayer reflective film 21, and lowering the stress on the multilayer reflective film 21.

[Reflective Mask Blank]

Next, the reflective mask blank 30 according to an exemplary embodiment of the present invention is described below.

Figure 3:
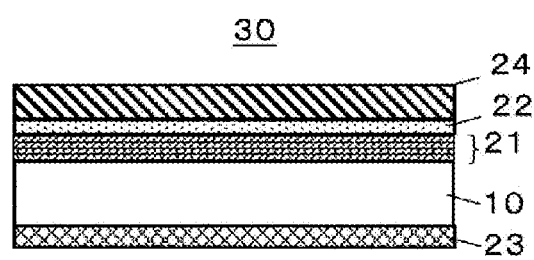
FIG. 3 is a schematic cross-sectional view illustrating an example of the configuration of a reflective mask blank according to an exemplary embodiment of the present invention.

FIG. 3 is a schematic diagram illustrating the reflective mask blank 30 according to this embodiment.

The reflective mask blank 30 according to the embodiment is configured to have the absorber film 24 to be a transfer pattern formed on the protective film 22 of the above-described substrate with a multilayer reflective film 20.

The material for the absorber film 24 is not particularly limited. For example, it is preferable to use Ta (tantalum) alone or those containing Ta as the main component among materials capable of absorbing EUV light. Usually, the material containing Ta as the main component is a Ta alloy. The crystalline state of such an absorber film should preferably have an amorphous or microcrystalline structure from the viewpoint of the smoothness and the flatness. As the material containing Ta as the main component, for example, a material containing Ta and B, a material containing Ta and N, a material containing Ta and B and further containing at least one of O and N, a material containing Ta and Si, a material containing Ta, Si and N, a material containing Ta and Ge, and a material containing Ta, Ge and N may be used. In addition, adding B, Si, Ge or the like to Ta easily provides an amorphous structure, which improves the smoothness. Further, adding N or O to Ta improves resistance against oxidation, making it possible to improve the stability over time.

It is preferable that the surface of the absorber film 24 should satisfy a relational equation of $(BA_{70}-BA_{30})/(BD_{70}-BD_{30}) \geq 350$ (%/nm), and have a maximum height (Rmax) $\leq 1.2$ nm in a relation between a bearing area (%) and a bearing depth (nm) obtained by measuring, with an atomic force microscope, an area of 1 µm×1 µm, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

It is desirable that more preferably, $(BA_{70}-BA_{30})/(BD_{70}-BD_{30}) \geq 400$ (%/nm), more preferably, $(BA_{70}-BA_{30})/(BD_{70}-BD_{30}) \geq 450$ (%/nm), and more preferably $(BA_{70}-BA_{30})/(BD_{70}-BD_{30}) \geq 500$ (%/nm). It is also desirable that the surface roughness of the absorber film 24 should preferably be set to maximum height (Rmax)$\leq 1.1$ nm, and more preferably, maximum height (Rmax)$\leq 1.0$ nm.

It is desirable that to permit the surface of the absorber film 24 to have the surface roughness and the bearing curve characteristics in the aforementioned ranges while maintaining the surface state of the substrate 10 or the substrate with a multilayer reflective film 20 in the aforementioned range, the absorber film 24 should have an amorphous structure. The crystal structure of the absorber film 24 can be measured by X-ray diffractometer (XRD).

The reflective mask blank according to the invention is not limited to the configuration illustrated in FIG. 3. For example, a resist film to be a mask for patterning the absorber film 24 may be formed on the absorber film, so that the reflective mask blank with resist film 30 may be regarded as the reflective mask blank according to the invention. The resist film to be formed on the absorber film 24 may be of a positive type or a negative type. Further, the reflective mask blank may be used for laser drawing as well as for electron beam writing. Furthermore, what is called a hard mask film (an etching mask film) may be formed between the absorber film 24 and the resist film, and this structure may also be included in the reflective mask blank according to invention.

[Reflective Mask]

Next, a reflective mask 40 according to an exemplary embodiment of the present invention is described below.

Figure 4:
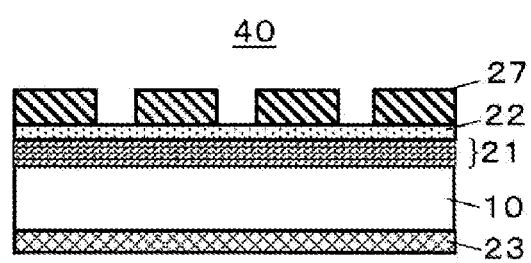
FIG. 4 is a schematic cross-sectional view illustrating an example of a reflective mask according to an exemplary embodiment of the present invention.

FIG. 4 is a schematic diagram illustrating the reflection type mask 40 of this embodiment.

The reflective mask 40 according to this embodiment is configured to have an absorber pattern 27 formed on the protective film 22 by patterning the absorber film 24 in the reflective mask blank 30. When the reflective mask 40 according to the embodiment is exposed with exposure light such as EUV light, the exposure light is absorbed at a portion of the mask surface where the absorber film 24 is present, and the exposure light is reflected by the protective film 22 and the multilayer reflective film 21 at the other portion where the absorber film 24 is removed. Accordingly, the reflective mask 40 can be used as the reflective mask 40 for lithography.

[Transmissive Mask Blank]

A transmissive mask blank 50 according to an exemplary embodiment of the present invention is described as follows.

Figure 5:
FIG. 5 is a schematic cross-sectional view illustrating an example of the configuration of a transmissive mask blank according to an exemplary embodiment of the present invention.

FIG. 5 is a schematic diagram illustrating the transmissive mask blank 50 according to this embodiment.

The transmissive mask blank 50 according to the embodiment configured to have a light shielding function film 51, to be a transfer pattern, formed on the main surface on that side of the above-described mask blank substrate 10 where a transfer pattern is formed.

Examples of the transmissive mask blank 50 include a binary mask blank, and a phase shift mask blank. Examples of the light shielding function film 51 include what is called a halftone film that attenuates exposure light and shifts the phase in addition to the light shielding film capable of blocking the exposure light.

The binary mask blank is obtained by depositing a light shielding film for shielding the exposure light on the mask blank substrate 10. This light shielding film is patterned to form a desired transfer pattern. Examples of the light shielding film include a Cr film, a Cr alloy film containing optionally oxygen, nitrogen, carbon or fluorine in Cr, a film having lamination thereof, a MoSi film, and a MoSi alloy film optionally containing oxygen, nitrogen or carbon in MoSi, and a film having lamination thereof. An antireflection layer having an antireflection function may be included in the surface of the light shielding film.

The phase shift mask blank is obtained by depositing a phase shift film for changing the phase difference of the exposure light on the mask blank substrate 10. This phase shift film is patterned to form a desired transfer pattern. Examples of the phase shift film include, in addition to a $SiO_2$ film having only a phase shift capability, a halftone film having a light shielding capability and a phase shift capability, such as a metal silicide oxide film having a light shielding capability and a phase shift capability, a metal silicide nitride film, a metal silicide oxynitride film, a metal silicide oxide carbide film, a metal silicide oxynitride carbide film (metal: transition metal such as Mo, Ti, W or Ta), a CrO film, a CrF film or a SiON film. The structure with the light shielding film formed on the phase shift film may be included in the phase-shift mask blank.

The transmissive mask blank 50 according to the invention is not limited to the configuration illustrated in FIG. 5. For example, a resist film, to be a mask for patterning the light shielding function film 51, may be formed on the light shielding function film 51, so that the transmissive mask blank with the resist film may be regarded as the transmissive mask blank according to the invention. As in the above-described case, the resist film formed on the light shielding function film 51 may be of a positive type or a negative type. Further, the transmissive mask blank may be used for laser drawing as well as for electron beam writing. Furthermore, what is called a hard mask film (an etching mask film) may be formed between the light shielding function film 51 and the resist film, and this structure may also be included in the transmissive mask blank according to invention.

It is preferable that the surface of the light shielding function film 51 should satisfy a relational equation of $(BA_{70}-BA_{30})/(BD_{70}-BD_{30}) \geq 350$ (%/nm), and have a maximum height (Rmax)$\leq 1.2$ nm in a relation between a bearing area (%) and a bearing depth (nm) obtained by measuring, with an atomic force microscope, an area of 1 µm×1 µm, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

It is desirable that more preferably, $(BA_{70}-BA_{30})/(BD_{70}-BD_{30}) \geq 400$ (%/nm), more preferably, $(BA_{70}-BA_{30})/(BD_{70}-BD_{30}) \geq 450$ (%/nm), and more preferably $(BA_{70}-BA_{30})/(BD_{70}-BD_{30}) \geq 500$ (%/nm). It is also desirable that the surface roughness of the light shielding function film 51 should preferably be set to maximum height (Rmax)$\leq 1.1$ nm, and more preferably, maximum height (Rmax)$\leq 1.0$ nm.

To permit the surface of the light shielding function film 51 to have the surface roughness and bearing curve characteristics in the aforementioned range while maintaining the surface state of the substrate 10 in the aforementioned range, it is preferable that the surface of the light shielding function film

51 should have an amorphous structure. The crystal structure can be observed with an X-ray diffractometer (XRD).

[Transmissive Mask]

A transmissive mask 60 according to an exemplary embodiment of the present invention is described as follows.

Figure 6:
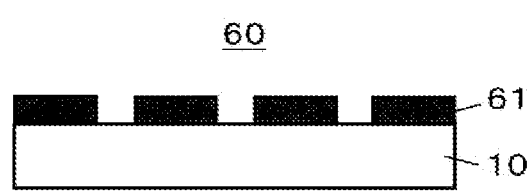
FIG. 6 is a schematic cross-sectional view illustrating an example of a transmissive mask according to an exemplary embodiment of the present invention.
Figure 7:
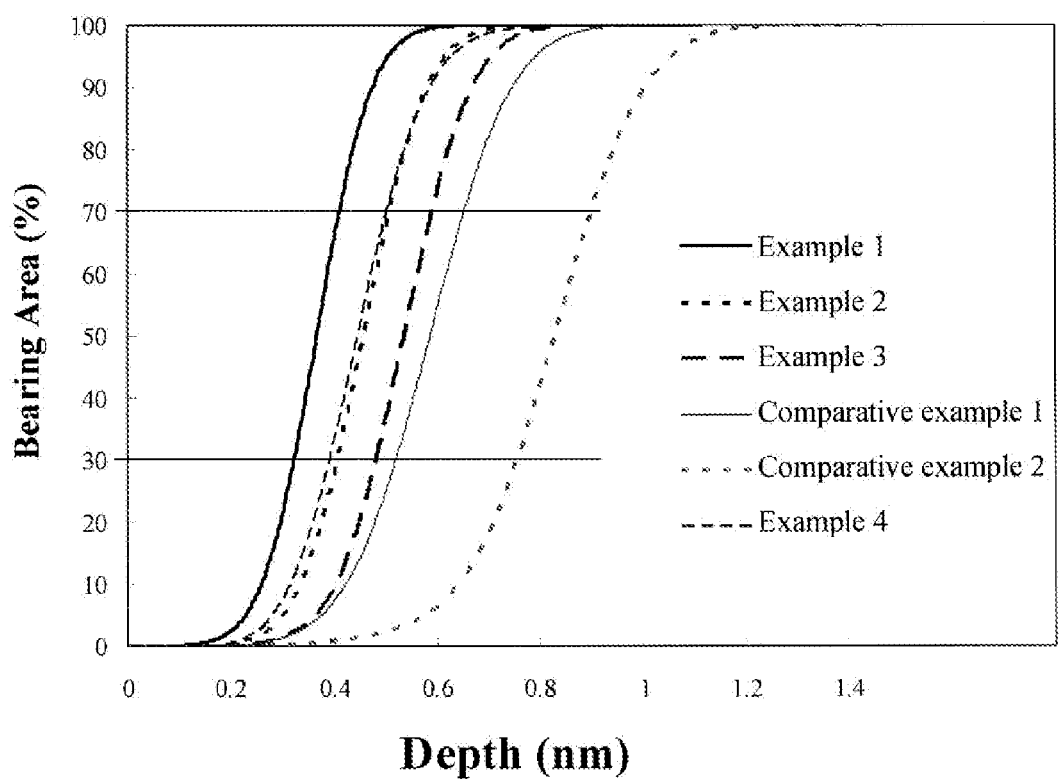
FIG. 7 is a graph illustrating the results of measuring the bearing curve of the surface roughness of the mask blank substrates according to Examples 1 to 4 of the present invention and Comparative Examples 1 and 2.

FIG. 6 is a schematic diagram illustrating the transmissive mask 60 according to the present embodiment.

The transmissive mask 60 according to this embodiment is configured to have a light-shielding-function film pattern 61 formed on the mask blank substrate 10 by patterning the light shielding function film 51 in the transmissive mask blank 50. When the transmissive mask 60 according to the invention is a binary mask and is exposed with exposure light such as ArF excimer laser light, the exposure light is shielded at a portion of the mask surface where the light shielding function film 51 is present, and the exposure light passes through the mask blank substrate 10 at the other portion where the light shielding function film 51 is removed. Accordingly, the transmissive mask can be used as the transmissive mask 60 for lithography. When a halftone phase shift mask which is one type of phase shift mask is exposed with exposure light such as ArF excimer laser light, he exposure light passes through the exposed mask blank substrate 10 at a portion of the mask surface where the light shielding function film 51 is removed, and the exposure light is attenuated and passes while having a predetermined amount of phase shift at a certain portion of the light shielding function film 51. Accordingly, the transmissive mask can be used as the transmissive mask 60 for lithography. Further, the phase shift mask is not limited to the aforementioned halftone phase shift mask, and may be phase shift masks using various phase-shifting effects, such as an alternative phase shift mask.

[Method of Manufacturing Semiconductor Device]

A semiconductor device having various patterns or the like formed on a semiconductor substrate can be manufactured by transferring a transfer pattern that is a circuit pattern or the like based on an absorber pattern 27 of the reflective mask 40 or the light-shielding-function film pattern 61 of the transmissive mask 60, to the resist film formed on the a transferred substrate such as the semiconductor substrate, by a lithography process using the above-described reflective mask 40 and the transmissive mask 60, and the exposure apparatus, and through various other processes.

It is noted that reference marks may be formed on the above-described mask blank substrate 10, substrate with a multilayer reflective film 20, reflective mask blank 30 and transmissive mask blank 50, and the fiducial marks and the locations of critical defects detected with the aforementioned high-sensitivity defect inspection apparatus can be managed based on the coordinates. At the time of fabricating the reflective mask 40 or the transmissive mask blank 50 based on the obtained positional information (defect data), drawing data is corrected based on the defect data and data on the transfer pattern to be transferred (circuit pattern) in such a way that the absorber pattern 27 or the light-shielding-function film pattern 61 is formed at locations where critical defects are present, thereby reducing defects.

EXAMPLES

Referring to FIGS. 7 to 10, Examples 1 to 3 and Examples 5 to 7 including the embodiments of the mask blank substrate, substrate with a multilayer reflective film, reflective mask blank and reflective mask for EUV exposure according to the invention, Comparative Examples 1 and 2 for those Examples, and Example 4 including the embodiments of the mask blank substrate, transmissive mask blank and transmissive mask for ArF excimer laser exposure according to the invention, are described as follows.

Example 1

First, Example 1 for the mask blank substrate and the substrate with a multilayer reflective film for EUV exposure according to the invention, and the reflective mask blank and the reflective mask for EUV exposure is described.

<Fabrication of Mask Blank Substrate>

For a mask blank substrate 10, a $SiO_2$—$TiO_2$ glass substrate with a size of 152.4 mm×152.4 mm and a thickness of 6.35 mm was prepared, and the top and bottom sides of the glass substrate were polished step by step with cerium oxide abrasive particles or colloidal silica abrasive grains using a double-side polishing apparatus. Then, the glass substrate was subjected to a surface treatment with hydrosilicofluoric acid of a low concentration. The surface roughness of the surface of the glass substrate provided through the treatment was measured with an atomic force microscope, and the root mean square roughness (Rms) was 0.15 nm.

The surface shapes (surface state, flatness) of areas of 148 mm×148 mm at the top and bottom sides of the glass substrate and TTV (variation in thickness) were measured with a wavelength shift interferometer using a laser wavelength modulation. As a result, the flatnesses of the top and bottom sides of the glass substrate were 290 nm (convex shape). The results of measuring the surface shape (flatness) of the surfaces of the glass substrate was saved in a computer as height information with respect to a reference surface provided for each measuring point, and was compared with a reference value of 50 nm (convex shape) of the flatness of the top surface and the a reference value of 50 nm of the flatness of the bottom surface needed for the glass substrate, and a difference between the comparison results (required amount of removal) was computed by the computer.

Then, the processing conditions for the local surface processing according to the required amount of removal were set for each area with a processing spot shape in the surface of the glass substrate. A dummy substrate was spot-processed in advance in the same manner as in the actual processing without being moved for a given period of time, the shape of the dummy substrate was measured with the same measuring device as used to measure the shapes of the top and bottom surfaces, and the volume of spot processing per unit time was measured. Then, the scanning speed for raster scanning of the glass substrate was decided according to the required amount of removal obtained from the spot information and the information on the surface shape of the glass substrate.

The surface shape was adjusted by performing a local surface treatment by magneto rheological finishing (MRF) according to the set processing conditions to be set, using a substrate finishing device with magnetic fluid, in such a way that the flatnesses of the top and bottom sides of the glass substrate would not become more than the reference value described above. It is noted that the magnetic viscoelastic fluid used for this treatment contained an iron component, and the polishing slurry was an aqueous alkali solution+abrasives (about 2 wt %) with the abrasive being cerium oxide. Thereafter, the glass substrate was immersed in a cleaning bath (temperature of about 25° C.) containing aqueous hydrochloric acid with a concentration of about 10% for about 10 minutes, and then rinsed with pure water and dried by isopropyl alcohol.

The surface shape (surface state, flatness) of the obtained glass substrate surface was measured; the flatnesses of the top and bottom sides were about 40 to 50 nm. Further, the surface roughness of the surface of the glass substrate in an area of 1 μm×1 μm at an arbitrary location in the transfer-pattern forming area (132 mm×132 mm) was measured with an atomic force microscope, showing the root mean square roughness (Rms) of 0.37 nm, which rougher than the surface roughness before the local surface treatment with MRF.

Therefore, both sides were polished with a double-side polishing apparatus under the polishing conditions to keep or improve the surface shape of the surfaces of the glass substrate. This finish polishing was performed under the following polishing conditions:

working fluid: aqueous alkaline solution (NaOH)+abrasive (concentration: about 2 wt %)

abrasive: colloidal silica, average particle size: about 70 nm polishing plate rotational speed: about 1 to 50 rpm processing pressure: about 0.1 to 10 kPa polishing time: about 1 to 10 minutes.

Then, the glass substrate was rinsed with an aqueous alkaline solution (NaOH) to provide a mask blank substrate 10 of EUV exposure.

The flatnesses and surface roughnesses of the top and bottom sides of the provided mask blank substrate 10 were measured, and the flatnesses of the top and bottom sides were about 40 nm, which kept or improved the surface states before the double-side polishing and it is preferable. Further, an area of 1 μm×1 μm at an arbitrary location in the transfer-pattern forming area (132 mm×132 mm) in the provided mask blank substrate 10 was measured with an atomic force microscope, and the root mean square roughness (Rms) was 0.13 nm, and the maximum height (Rmax) was 1.2 nm.

The local processing method for the mask blank substrate 10 according to the invention is not limited to the aforementioned magnetic viscoelastic fluid polishing method. The processing method may use gas cluster ion beams (GCIB) or local plasma.

Next, a TaBN film was deposited on the main surface of the aforementioned mask blank substrate 10 by DC magnetron sputtering. With a TaB target set to face the main surface of the mask blank substrate, reactive sputtering was performed under Ar+$N_2$ gas atmosphere. The elemental composition of the TaBN film was measured by Rutherford backscattering spectrometry, resulting in Ta: 80 atomic %, B: 10 atomic %, and N: 10 atomic %. The thickness of the TaBN film was 150 nm. Measurement of the crystal structure of the TaBN film showed that the crystal structure was an amorphous structure.

Then, the surface of the TaBN film was subjected to ultra-precision polishing using a single-side polishing apparatus. This ultra-precision polishing was performed under the following polishing conditions:

working fluid: aqueous alkaline solution (NaOH)+abrasive (average abrasive grain of 50 nm of colloidal silica, concentration: 5 wt %)

processing pressure: 50 g/cm$^2$ polishing time: about 1 to 10 minutes

Next, the surface of the TaBN film was rinsed for 428 seconds with an aqueous solution of hydrofluoric acid (HF: concentration of 0.2 wt %), providing a mask blank substrate for EUV exposure.

An area of 1 μm×1 μm at an arbitrary location in the transfer-pattern forming area (132 mm×132 mm) on the surface of the TaBN film of the mask blank substrate 10 for EUV exposure provided as Example 1 was measured with an atomic force microscope; the surface roughness was 0.085 nm in terms of the root mean square roughness (Rms), and the maximum height (Rmax) was 1.1 nm. The results of measuring the bearing curve characteristics of the TaBN film surface according to Example 1 are shown by the thick solid line for "Example 1" in the graphs in FIGS. 7 and 8. The ordinate in each graph represents the bearing area (%), and the abscissa represents the bearing depth (nm).

As shown in those figures, as a result of measuring an area of 1 μm×1 μm of the surface of the TaBN film according to Example 1 with an atomic force microscope, the bearing depth $BD_{30}$ for the bearing area of 30% ($BA_{30}$) was 0.322 nm. Further, the bearing depth $BD_{70}$ for the bearing area of 70% ($BA_{70}$) was 0.410 nm. Substituting those values in ($BA_{70}$−$BA_{30}$)/($BD_{70}$−$BD_{30}$) yielded (70−30)/(0.410−0.322)=455 (%/nm). Therefore, the surface roughness of the TaBN film according to Example 1 satisfies ($BA_{70}$−$BA_{30}$)/($BD_{70}$−$BD_{30}$) ≥350 (%/nm), and maximum height (Rmax)≤1.2 nm.

Figure 8:
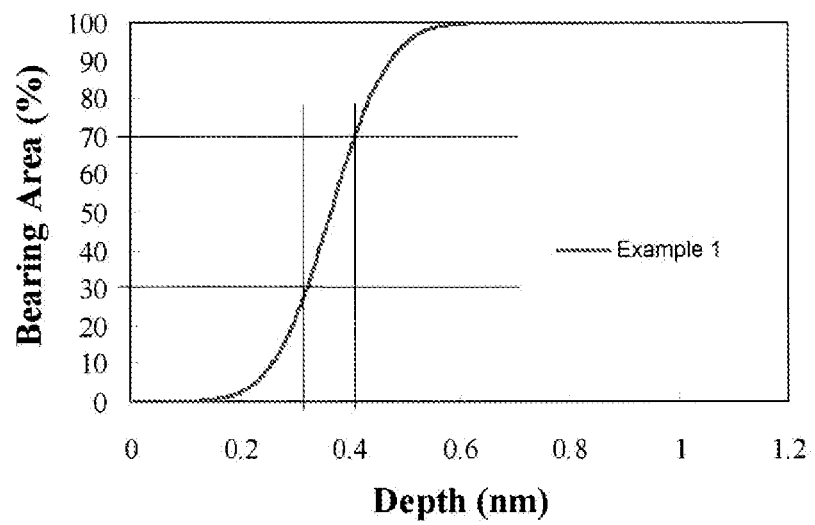
FIG. 8(a) is a graph illustrating the results of measuring the bearing curve according to the Example 1.
FIG. 8(b) is a graph illustrating a frequency distribution plotting the relation between the bearing depth and the frequency (%) thereof according to the Example 1.
Figure 8:
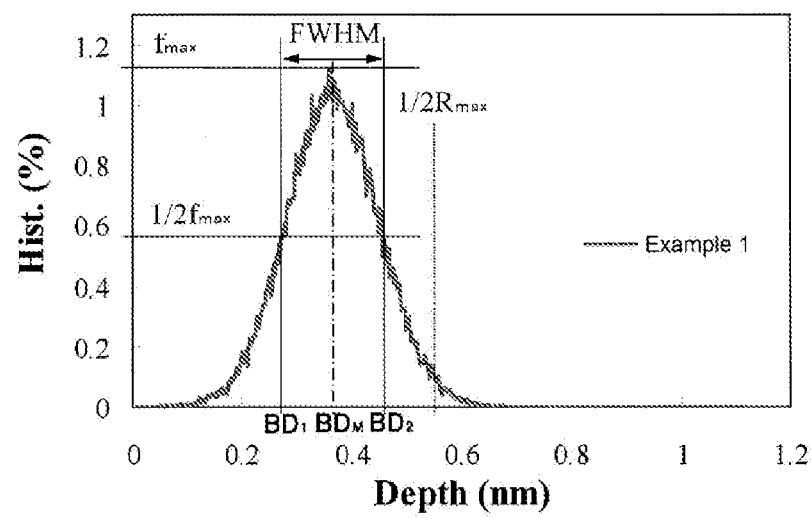
Figure 9:
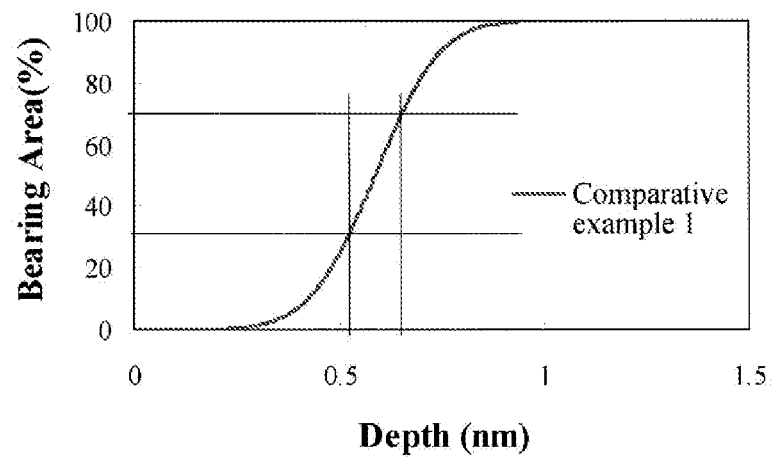
FIG. 9(a) is a graph illustrating the results of measuring the bearing curve according to the Comparative Example 1.
FIG. 9(b) is a graph illustrating a frequency distribution plotting the relation between the bearing depth and the frequency (%) thereof according to the Comparative Example 1.
Figure 9:
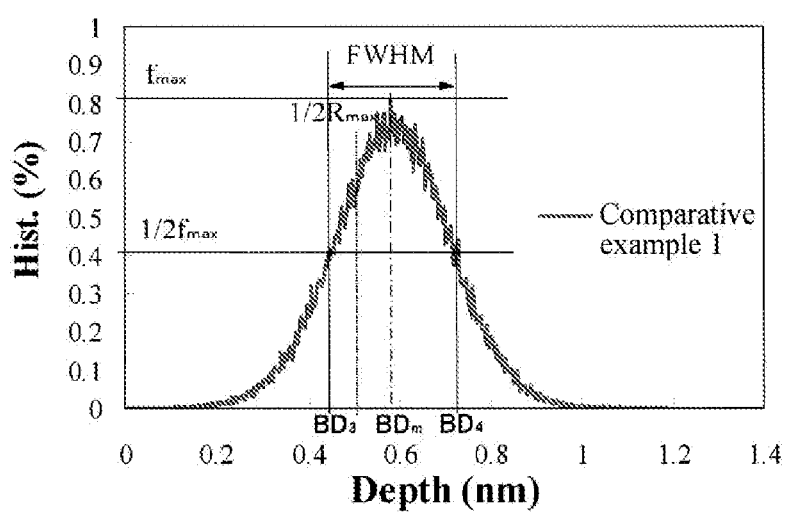
Figure 10:
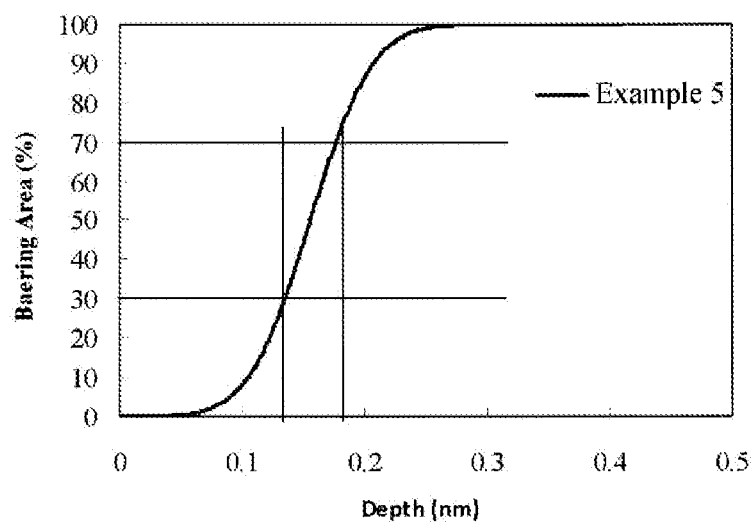
FIG. 10(a) is a graph illustrating the results of measuring the bearing curve according to Example 5.
FIG. 10(b) is a graph illustrating a frequency distribution plotting the relation between the bearing depth and the frequency (%) thereof according to the Example 5.
Figure 10:
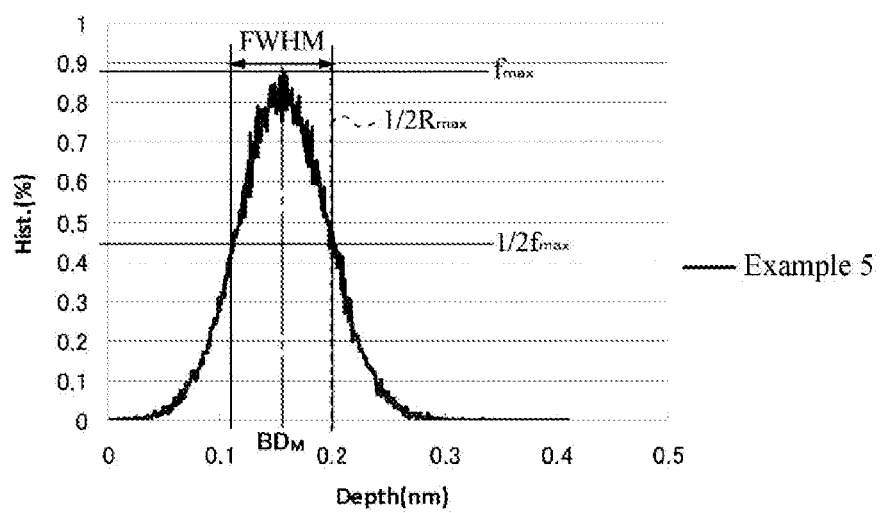

The graph in FIG. 8(*b*) illustrates a frequency distribution plotting the relation between the bearing depth and the frequency thereof, obtained by measuring the results of measuring an area of 1 μm×1 μm at an arbitrary location of a transfer-pattern forming area (132 mm×132 mm) on the surface of the TaBN film of Example 1 with an atomic force microscope. The ordinate of the graph represents the frequency (%), and the abscissa represents the bearing depth (nm).

In the frequency distribution shown in FIG. 8(*b*), the value of a highest frequency (maximum frequency) $f_{max}$ in the irregularities in the measuring area of the surface of the TaBN film according to Example 1, was 1.118% of the frequency (Hist.) and the corresponding bearing depth (Depth) was 0.361 nm. Based on those values, two bearing depths ($BD_1$, $BD_2$) corresponding to ½$f_{max}$ (0.5 $f_{max}$) were specified to obtain the bearing depth ($BD_M$) corresponding to the center of the FWHM (Full Width at Half Maximum). The bearing depth ($BD_M$) corresponding to the center of the FWHM is shown by the alternate long and short dash line in the graph. The bearing depth (½Rmax=0.5 Rmax) corresponding to half the maximum height (Rmax) in Example 1 is shown by the dashed line in the graph. The comparison of these alternate long and short dash line and dashed line with each other shows that the bearing depth ($BD_M$) corresponding to the center of the FWHM is positioned to the left of the bearing depth corresponding to ½Rmax in the graph. More specifically, the bearing depth corresponding to the center of FWHM was 0.34 nm, and the bearing depth corresponding to half the maximum height (Rmax) was 0.56 nm. Therefore, the surface of the TaBN film according to Example 1 satisfies the condition that the absolute value of the bearing depth ($BD_M$) corresponding to the center of FWHM is smaller than the bearing depth corresponding to half the maximum height (Rmax).

Defect inspection of an area of 132 mm×132 mm at the surface of the TaBN film of Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 18,789, showing that the false defects was significantly suppressed compared with the conventional number (more than 100,000) of detected defects. The total number of detected defects of about 18,789 can ensure that presence or absence of critical defects such as a foreign matter or scratches is easily inspected. The SEVD can be calculated from SEVD=$2(3S/4\pi h)^{1/3}$ where S represents the area of a defect and h represents the height of the defect. (The same is true of the following Examples and Comparative Examples.) The defect area S and the defect height h can be measured by an atomic force microscopy (AFM).

Further, defect inspection of an area of 132 mm×132 mm at the surface of the TaBN film of Example 1 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, which enables inspection of critical defects.

<Fabrication of Substrate with Multilayer Reflective Film>

The substrate with a multilayer reflective film 20 was fabricated by forming the multilayer reflective film 21 having alternate lamination of high refractive index layers and low refractive index layers, and the protective film 22 on the surface of the TaBN film, of the above-described mask blank substrate 10 for EUV exposure by ion beam sputtering.

For the multilayer reflective film 21, 40 pairs of Si and Mo films, each pair having a Si film with a thickness of 4.2 nm and a Mo film with a thickness of 2.8 nm (total film thickness of 280 nm), were deposited. Further, the protective film 22 of Ru with a thickness of 2.5 nm was deposited on the surface of the multilayer reflective film 21. It is noted that the multilayer reflective film 21 was deposited by ion beam sputtering in such a way that the incident angle of sputtered particles for the Si film to the normal line of the main surface of the substrate was 5 degrees, and the incident angle of sputtered particles for the Mo films thereto was 65 degrees.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.141 nm in terms of the root mean square roughness (Rms), and the maximum roughness (Rmax) was 1.49 nm.

As a result of measuring an area of 1 μm×1 μm of the surface of the protective film according to Example 1 with an atomic force microscope, the bearing depth $BD_{30}$ for the bearing area of 30% ($BA_{30}$) was 0.575 nm. Further, the bearing depth $BD_{70}$ for the bearing area of 70% ($BA_{70}$) was 0.745 nm. Substituting those values in $(BA_{70}-BA_{30})/(BD_{70}-BD_{30})$ yielded $(70-30)/(0.745-0.575)=235$ (%/nm). Therefore, the surface roughness of the substrate with a multilayer reflective film according to Example 1 satisfies $(BA_{70}-BA_{30})/(BD_{70}-BD_{30}) \geq 230$ (%/nm), and maximum height (Rmax)≤1.5 nm.

Defect inspection of an area of 132 mm×132 mm at the surface of the protective film of the substrate with a multilayer reflective film 20 of Example 1 was performed with the inspection sensitivity that permits detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 19,132, showing that the false defects was significantly suppressed compared with the conventional number (more than 100,000) of detected defects. In addition, the reflectance for EUV light was measured, resulting in good results of 65%.

Further, defect inspection of an area of 132 mm×132 mm at the surface of the multilayer reflective film of Example 1 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, enabling inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD of not more than 20 nm.

Fiducial marks for managing coordinates were formed on the protective film 22 and the multilayer reflective film 21 of the substrate with a multilayer reflective film 20 of Example 1 at four locations outside the transfer-pattern forming area (132 mm×132 mm) by a focused ion beam.

<Fabrication of Reflective Mask Blank for EUV Exposure>

The back-side conductive film 23 was formed by DC magnetron sputtering, on the bottom side of the aforementioned substrate with a multilayer reflective film 20 where the multilayer reflective film 21 was not formed. For the back-side conductive film 23, reactive sputtering was performed on the back-side conductive film 23, with a Cr target set to face the bottom side of the substrate with a multilayer reflective film 20, under $Ar+N_2$ ($Ar:N_2=90\%:10\%$) gas atmosphere. The elemental composition of the back-side conductive film 23 was measured by Rutherford backscattering spectrometry. The results were Cr: 90 atomic % and N: 10 atomic %. The thickness of the back-side conductive film 23 was 20 nm.

Further, the absorber film 24 comprising a TaBN film was deposited by DC magnetron sputtering, on the surface of the protective film 22 of the aforementioned substrate with a multilayer reflective film 20, thereby fabricating the reflective mask blank 30. For the absorber film 24, reactive sputtering was performed on the absorber film 24 with a TaB target (Ta:B=80:20) set to face the absorber film 24 of the substrate with a multilayer reflective film 20, under $Xe+N_2$ gas (Xe:$N_2=90\%:10\%$) atmosphere. The elemental composition of the absorber film 24 was measured by Rutherford backscattering spectrometry. The results were Ta: 80 atomic %, B: 10 atomic %, and N: 10 atomic %. In addition, the thickness of the absorber film 24 was 65 nm. Measurement of the crystal structure of the absorber film 24 showed that the crystal structure was an amorphous structure.

A resist was coated on the surface of the aforementioned absorber film 24 by spin coating, followed by heating and cooling processes, for forming a resist film 25 with a thickness of 150 nm. Then, a resist pattern was formed through desired drawing and developing. With the resist pattern used as a mask, the TaBN film serving as the absorber film 24 was patterned by dry etching with a $Cl_2+He$ gas, forming the absorber pattern 27 on the protective film 22. Then, the resist film 25 was removed, and the resultant structure was chemically cleaned in the above-described manner to fabricate the reflective mask 40. In the drawing process, drawing data was corrected in such a way that the absorber pattern 27 was placed at a location where critical defects are present, based on defect data created based on the fiducial marks, and data on a pattern to be transferred (circuit pattern), thus fabricating the reflective mask 40. Defection inspection of the provided reflective mask 40 was performed using the high-sensitivity defect inspection apparatus ("Teron 600 series" of KLA-Tencor Corp.), but defects were not observed.

Example 2

Fabrication of Mask Blank Substrate

An $SiO_2$—$TiO_2$ glass substrate with a size of 152.4 mm×152.4 mm and a thickness of 6.35 mm was prepared as the mask blank substrate 10 for EUV exposure, and the top and bottom sides of the glass substrate were subjected to processes from polishing with the double-side polishing apparatus to the local surface treatment by magnetic viscoelastic fluid polishing, with the same manner as in Example 1.

Thereafter, noncontact polishing of the top and bottom sides of the glass substrate was performed as finish polishing in the local surface treatment. In Example 2, EEM (Elastic Emission Machining) was performed as the non-contact polishing. The EEM was performed under the following processing conditions.

working fluid (first stage): aqueous alkaline solution (NaOH)+fine particles (concentration: 5 wt %)
working fluid (second stage): pure water
fine powder particles: colloidal silica, average particle size: about 100 nm
rotational body: polyurethane roll
rotational speed of the rotating body: 10 to 300 rpm
rotational speed of the work holder: 10 to 100 rpm
polishing time: 5 to 30 minutes An area of 1 μm×1 μm at an arbitrary location in the transfer-pattern forming area (132 mm×132 mm) on the main surface of the mask blank substrate 10 for EUV exposure provided by Example 2 was measured with an atomic force microscope; the root mean square roughness (Rms) was 0.10 nm, and the maximum height (Rmax) was 0.92 nm. The results of measuring the bearing curve of the main surface of the provided mask blank substrate 10 for EUV exposure are shown by the short and thick dashed line for "Example 2" in the graph in FIG. 7.

As shown in the figure, as a result of measuring an area of 1 μm×1 μm of the main surface of the mask blank substrate 10 for EUV exposure of Example 2 with an atomic force microscope, the bearing depth $BD_{30}$ for the bearing area of 30% ($BA_{30}$) was 0.388 nm. Further, the bearing depth $BD_{70}$ for the bearing area of 70% ($BA_{70}$) was 0.499 nm. Substituting those values in $(BA_{70}-BA_{30})/(BD_{70}-BD_{30})$ yielded $(70-30)/(0.499-0.388)=364$ (%/nm). Therefore, the main surface of the mask blank substrate 10 according to Example 2 satisfies $(BA_{70}-BA_{30})/(BD_{70}-BD_{30}) \geq 350$ (%/nm), and maximum height (Rmax)≤1.2 nm.

Although not illustrated, the bearing depth corresponding to the center of the FWHM and the bearing depth corresponding to ½ (half) of the maximum height (Rmax) of the main surface of the mask blank substrate of Example 2 were obtained from the frequency distribution plot of the relation between the bearing depth and the frequency thereof, with the same manner as Example 1; the bearing depth corresponding to the center of the FWHM was 0.44 nm, and the bearing depth corresponding to ½ (half) of the maximum height (Rmax) was 0.46 nm. Therefore, the main surface of the mask blank substrate according to Example 2 satisfies the condition that the absolute value of the bearing depth corresponding to the center of the FWHM is smaller than the bearing depth corresponding to ½ (half) of the maximum height (Rmax).

Defect inspection of an area of 132 mm×132 mm at the main surface of the mask blank substrate 10 for EUV exposure of Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 29,129, showing that the false defects was significantly suppressed compared with the conventional number (more than 100,000) of detected defects. The total number of detected defects of about 29,129 can ensure that presence or absence of critical defects such as a foreign matter or scratches is easily inspected.

Further, defect inspection of an area of 132 mm×132 mm at the mask blank substrate for EUV exposure of Example 2 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, enabling inspection of critical defects.

<Fabrication of Substrate with Multilayer Reflective Film>

The multilayer reflective film 21 with a thickness 280 nm having Si films and Mo films alternately laminated as done in Example 1 was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.143 nm in terms of the root mean square roughness (Rms), and the maximum roughness (Rmax) was 1.50 nm.

As a result of measuring an area of 1 μm×1 μm of the surface of the protective film according to Example 2 with an atomic force microscope, the bearing depth $BD_{30}$ for the bearing area of 30% ($BA_{30}$) was 0.612 nm. Further, the bearing depth $BD_{70}$ for the bearing area of 70% ($BA_{70}$) was 0.785 nm. Substituting those values in $(BA_{70}-BA_{30})/(BD_{70}-BD_{30})$ yielded $(70-30)/(0.785-0.612)=231$ (%/nm). Therefore, the surface roughness of the substrate with a multilayer reflective film according to Example 2 satisfies $(BA_{70}-BA_{30})/(BD_{70}-BD_{30}) \geq 230$ (%/nm), and maximum height (Rmax)≤1.5 nm.

Defect inspection of an area of 132 mm×132 mm at the surface of the protective film of the substrate with a multilayer reflective film 20 of Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 30,011, showing that the false defects was significantly suppressed compared with the conventional number (more than 100,000) of detected defects.

Further, defect inspection of an area of 132 mm×132 mm at the surface of the protective film according to Example 2 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, enabling inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm under the best inspection sensitivity conditions, and defect inspection was performed using the high-sensitivity defect inspection apparatus with an inspection light source wavelength of 13.5 nm under the inspection sensitivity conditions that permit detection of defects with the SEVD of not more than 20 nm in terms of SEVD (Sphere Equivalent Volume Diameter).

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

Example 3

Fabrication of Mask Blank Substrate

In this Example 3, a $SiO_2$—$TiO_2$ glass substrate with a size of 152.4 mm×152.4 mm and a thickness of 6.35 mm was prepared as the mask blank substrate 10 for EUV exposure, with the same manner as in Examples 1 and 2, and the mask blank substrate 10 for EUV exposure was fabricated through substantially the same processes as taken in Example 2. It is noted that in Example 3, EEM processing at the second stage using pure water as the working fluid was omitted in finish polishing in the local surface treatment in Example 2. The mask blank substrate 10 was fabricated in the same manner as Example 2 except for this process.

An area of 1 μm×1 μm at an arbitrary location in the transfer-pattern forming area (132 mm×132 mm) on the main surface of the mask blank substrate 10 for EUV exposure provided by Example 3 was measured with an atomic force microscope; the root mean square roughness (Rms) was 0.11 nm, and the maximum height (Rmax) was 0.98 nm. The results of measuring the bearing curve of the main surface of the provided mask blank substrate 10 for EUV exposure are shown by the long and thick dashed line for "Example 3" in the graph in FIG. 7.

As shown in the figure, as a result of measuring an area of 1 μm×1 μm of the main surface of the mask blank substrate 10 for EUV exposure according to Example 3 with an atomic force microscope, the bearing depth $BD_{30}$ for the bearing area of 30% ($BA_{30}$) was 0.480 nm. Further, the bearing depth $BD_{70}$ for the bearing area of 70% ($BA_{70}$) was 0.589 nm. Substituting those values in $(BA_{70}-BA_{30})/(BD_{70}-BD_{30})$ yielded (70−30)/(0.589−0.480)=367 (%/nm). Therefore, the main surface of the mask blank substrate 10 according to Example 3 satisfies $(BA_{70}-BA_{30})/(BD_{70}-BD_{30}) \geq 350$ (%/nm), and maximum height (Rmax)≤1.2 nm.

Although not illustrated, the bearing depth corresponding to the center of the FWHM and the bearing depth corresponding to ½ (half) of the maximum height (Rmax) of the main surface of the mask blank substrate of Example 3 were obtained from the frequency distribution plot of the relation between the bearing depth and the frequency thereof, with the same manner as Example 1; the bearing depth corresponding to the center of the FWHM was 0.53 nm, and the bearing depth corresponding to ½ (half) of the maximum height (Rmax) was 0.49 nm. Therefore, the main surface of the mask blank substrate according to Example 3 does not satisfy the condition that the absolute value of the bearing depth corresponding to the center of the FWHM is smaller than the bearing depth corresponding to ½ (half) of the maximum height (Rmax).

Defect inspection of an area of 132 mm×132 mm at the main surface of the mask blank substrate 10 for EUV exposure of Example 3 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 36,469, showing that the false defects was significantly suppressed compared with the conventional number (more than 100,000) of detected defects. The total number of detected defects of about 36,469 can ensure that presence or absence of critical defects such as a foreign matter or scratches is easily inspected.

Further, defect inspection of an area of 132 mm×132 mm at the mask blank substrate 10 for EUV exposure of Example 3 was performed under the best inspection sensitivity conditions using the high-sensitivity defect inspection apparatus ("MAGICS M7360" of Lasertec Corp.) with an inspection light source wavelength of 266 nm, resulting in that the total number of detected defects in each detection was less than 100,000, enabling inspection of critical defects.

<Fabrication of Substrate with Multilayer Reflective Film>

The multilayer reflective film 21 with a thickness 280 nm having Si films and Mo films alternately laminated as done in Example 1 was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.146 nm in terms of the root mean square roughness (Rms), and the maximum height (Rmax) was 1.50 nm.

As a result of measuring an area of 1 μm×1 μm of the surface of the protective film according to Example 3 with an atomic force microscope, the bearing depth $BD_{30}$ for the bearing area of 30% ($BA_{30}$) was 0.648 nm. Further, the bearing depth $BD_{70}$ for the bearing area of 70% ($BA_{70}$) was 0.821 nm. Substituting those values in $(BA_{70}-BA_{30})/(BD_{70}-BD_{30})$ yielded (70−30)/(0.821−0.648)=231 (%/nm). Therefore, the surface roughness of the substrate with a multilayer reflective film according to Example 3 satisfies $(BA_{70}-BA_{30})/(BD_{70}-BD_{30}) \geq 230$ (%/nm), and maximum height (Rmax)≤1.5 nm.

Defect inspection of an area of 132 mm×132 mm at the surface of the protective film of the substrate with a multilayer reflective film 20 of Example 3 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 38,856, showing that the false defects was significantly suppressed compared with the conventional number (more than 100,000) of detected defects.

Further, defect inspection of an area of 132 mm×132 mm at the surface of the protective film of Example 3 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, enabling inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD (Sphere Equivalent Volume Diameter) of not more than 20 nm.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

An increase in the number of detected defects on the surface of the protective film of the substrate with a multilayer reflective film with respect to the number of detected defects on the surface of the mask blank substrate of the aforementioned Examples 1, 2 and 3 was examined; Example 1 showed an increase of 343, Example showed an increase of 882, and Example 3 showed an increase of 2387. With regard to Examples 1 and 2, increases in the numbers of defects seem to have been suppressed because the irregularities constituting the surfaces of the main surfaces of the mask blank substrates according to Example 1, 2 have such a surface states that the ratio of concave portions to convex portions with respect to the reference surfaces are greater, so that when a multilayer reflective films and a protective films are laminated on the main surfaces of the substrates, the sizes of defects present on the main surfaces of the substrates tend to become smaller, which seems to have suppressed increases in the numbers of defects. With regard to Example 3, by way of contrast, the irregularities constituting the main surface of the mask blank substrate according to Example 3 have such a surface state that the ratio of convex portions to concave portions with respect to the reference surface is greater, so that when a multilayer reflective film and a protective film are laminated on the main surface of the substrate, the size of defects present on the main surface of the substrate tend to become greater, which seems to have resulted in increased defects.

From the above results, Examples 1 and 2 would be optimal substrates as a substrate to be used as a reflective mask blank for EUV exposure.

The non-contact polishing as finish polishing of the local surface treatment in Examples 2 and 3 are not limited to the above-described EEM. For example, it is possible to apply float polish or catalyst-referred etching. To obtain a surface state where the ratio of concave portions to convex portions in the irregularities constituting the main surface of the mask blank substrate with respect to the reference surface is greater, finish polishing of the main surface of the glass substrate is preferably non-contact polishing using water or pure water.

Comparative Example 1

Fabrication of Mask Blank Substrate

In Comparative Example 1, a $SiO_2$—$TiO_2$ glass substrate with a size of 152.4 mm×152.4 mm and a thickness of 6.35 mm was prepared as the mask blank substrate 10 for EUV exposure, with the same manner as in Example 2.

In Comparative Example 1, unlike in Example 2, as fine polishing in the local surface treatment, ultra-precision polishing was performed with single-side polishing apparatus using a polishing slurry comprising colloidal silica (average particle size of 50 nm, concentration of 5 wt %) adjusted to acidity with a pH of 0.5 to 4, and then rinsing with sodium hydroxide (NaOH) having a concentration of 0.1 wt % was performed for a rinsing time of 200 seconds.

An area of 1 μm×1 μm at an arbitrary location in the transfer-pattern forming area (132 mm×132 mm) on the main surface of the mask blank substrate 10 for EUV exposure provided by Comparative Example 1 was measured with an atomic force microscope; the root mean square roughness (Rms) was 0.11 nm, and the maximum height (Rmax) was 1.18 nm. The results of measuring the bearing curve of the main surface of the mask blank substrate 10 according to Comparative Example 1 are shown by the thin solid line for "Comparative Example 1" in the graphs in FIGS. 7 and 9(a).

As shown in those figures, as a result of measuring an area of 1 μm×1 μm of the surface of the TaBN film according to Comparative Example 1 with an atomic force microscope, the bearing depth $BD_{30}$ for the bearing area of 30% ($BA_{30}$) was 0.520 nm. Further, the bearing depth $BD_{70}$ for the bearing area of 70% ($BA_{70}$) was 0.652 nm. Substituting those values in $(BA_{70}-BA_{30})/(BD_{70}-BD_{30})$ yielded $(70-30)/(0.652-0.520)=303$ (%/nm). Therefore, the surface roughness of the TaBN film according to Comparative Example 1 does not satisfy $(BA_{70}-BA_{30})/(BD_{70}-BD_{30}) \geq 350$ (%/nm).

The graph in FIG. 9(b) illustrates a frequency distribution plotting the relation between the bearing depth and the frequency thereof, obtained by measuring the results of measuring an area of 1 μm×1 μm at an arbitrary location of a transfer-pattern forming area (132 mm×132 mm) on the main surface of the mask blank substrate 10 of Comparative Example 1 with an atomic force microscope. The ordinate of the graph represents the frequency (%), and the abscissa represents the bearing depth (nm).

In the frequency distribution shown in FIG. 9(b), the value of a highest frequency (maximum frequency) $f_{max}$ in the irregularities in the measuring area of the main surface of the mask blank substrate 10 according to Comparative Example 1 was 0.809% of the frequency (Hist.) and the corresponding bearing depth (Depth) was 0.58 nm. Based on those values, two bearing depths ($BD_3$, $BD_4$) corresponding to $\frac{1}{2}f_{max}$ (0.5 $f_{max}$) were specified to obtain the bearing depth ($BD_m$) corresponding to the center of the FWHM (Full Width at Half Maximum). The bearing depth ($BD_m$) corresponding to the center of the FWHM is shown by the alternate long and short dash line in the graph.

The bearing depth (½Rmax=0.5 Rmax) corresponding to half the maximum height (Rmax) in Comparative Example 1 is shown by the dashed line in the graph. The comparison of these alternate long and short dash line and dashed line with each other shows that the bearing depth ($BD_m$) corresponding to the center of FWHM is positioned to the right of the bearing depth corresponding to ½Rmax in the graph. More specifically, the bearing depth corresponding to the center of FWHM was 0.56 nm, and the bearing depth corresponding to half the maximum height (Rmax) was 0.59 nm. For the main surface of the mask blank substrate 10 according to Comparative Example 1, therefore, the absolute value of the bearing depth corresponding to the center of FWHM is greater than the bearing depth corresponding to half the maximum height (Rmax).

Defect inspection of an area of 132 mm×132 mm at the main surface of the mask blank substrate 10 of Comparative Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, disabling inspection of the presence or absence of critical defects such as a foreign matter or scratches.

<Fabrication of Substrate with Multilayer Reflective Film>

The multilayer reflective film 21 with a thickness 280 nm having Si films and Mo films alternately laminated as done in Example 1 was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.165 nm in terms of the root mean square roughness (Rms), and the maximum height (Rmax) was 1.61 nm.

As a result of measuring an area of 1 μm×1 μm of the surface of the protective film according to Comparative Example 1 with an atomic force microscope, the bearing depth $BD_{30}$ for the bearing area of 30% ($BA_{30}$) was 0.703 nm. Further, the bearing depth $BD_{70}$ for the bearing area of 70% ($BA_{70}$) was 0.878 nm. Substituting those values in ($BA_{70}-BA_{30}$)/($BD_{70}-BD_{30}$) yielded (70−30)/(0.878−0.703)=229 (%/nm). Therefore, the surface roughness of the substrate with a multilayer reflective film according to Comparative Example 1 does not satisfy ($BA_{70}-BA_{30}$)/($BD_{70}-BD_{30}$)≥230 (%/nm), and maximum height (Rmax)≤1.5 nm.

Defect inspection of an area of 132 mm×132 mm at the surface of the protective film of the substrate with a multilayer reflective film 20 of Comparative Example 1 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, disabling inspection of the presence or absence of critical defects such as a foreign matter or scratches.

The same is true of the results of defect inspection of an area of 132 mm×132 mm at the surface of the protective film of Comparative Example 1 was performed under the inspection sensitivity conditions that permit detection of defects of not more than 20 nm in terms of SEVD (Sphere Equivalent Volume Diameter) using the high-sensitivity defect inspection apparatus with an inspection light source wavelength of 13.5 nm; the total number of defects detected including false defects exceeded 100,000, disabling inspection of the presence or absence of critical defects. The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); although several tens of defects were observed, defect correction was performed with a defect correcting device to provide a reflective mask.

Comparative Example 2

In Comparative Example 2, a $SiO_2$—$TiO_2$ glass substrate with a size of 152.4 mm×152.4 mm and a thickness of 6.35 mm was prepared as the mask blank substrate 10 for EUV exposure, with the same manner as in Example 2.

In Comparative Example 2, unlike in Example 2, as fine polishing in the local surface treatment, ultra-precision polishing was performed with single-side polishing apparatus using a polishing slurry comprising colloidal silica (average particle size of 50 nmm, concentration of 5 wt %) adjusted to alkalinity with a pH of 10, and then rinsing with hydrofluoric acid (HF) with a concentration of 0.2 wt % was performed for a rinsing time of 428 seconds.

An area of 1 μm×1 μm at an arbitrary location in the transfer-pattern forming area (132 mm×132 mm) on the main surface of the mask blank substrate 10 for EUV exposure provided by Comparative Example 2 was measured with an atomic force microscope; the root mean square roughness (Rms) was 0.15 nm, and the maximum height (Rmax) was 1.18 nm. The results of measuring the bearing curve of the main surface of the provided mask blank substrate 10 according to Comparative Example 2 are shown by the thin short dashed line for "Comparative Example 2" in the graph in FIG. 7.

As a result of measuring an area of 1 μm×1 μm of the surface of the protective film according to Comparative Example 2 with an atomic force microscope, the bearing depth $BD_{30}$ for the bearing area of 30% ($BA_{30}$) was 0.755 nm. Further, the bearing depth $BD_{70}$ for the bearing area of 70% ($BA_{70}$) was 0.900 nm. Substituting those values in ($BA_{70}-BA_{30}$)/($BD_{70}-BD_{30}$) yielded (70−30)/(0.901−0.756)=276 (%/nm). Therefore, the surface roughness of a surface of a TaBN film according to Comparative Example 2 does not satisfy ($BA_{70}-BA_{30}$)/($BD_{70}-BD_{30}$)≥350 (%/nm).

Although not illustrated, the bearing depth corresponding to the center of the FWHM and the bearing depth corresponding to ½ (half) of the maximum height (Rmax) of the main surface of the mask blank substrate of Comparative Example 2 were obtained from the frequency distribution plot of the relation between the bearing depth and the frequency thereof, with the same manner as Comparative Example 1; the bearing depth corresponding to the center of the FWHM was 0.74 nm, and the bearing depth corresponding to ½ (half) of the maximum height (Rmax) was 0.59 nm. Therefore, the main surface of the mask blank substrate according to Comparative Example 2 is such that the absolute value of the bearing depth corresponding to the center of the FWHM is greater than the bearing depth corresponding to ½ (half) of the maximum height (Rmax).

Defect inspection of an area of 132 mm×132 mm at the main surface of the mask blank substrate 10 for EUV exposure of Comparative Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, disabling inspection of the presence or absence of critical defects such as a foreign matter or scratches.

<Fabrication of Substrate with Multilayer Reflective Film>

The multilayer reflective film 21 with a thickness 280 nm having Si films and Mo films alternately laminated as done in Example 1 was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.173 nm in terms of the root mean square roughness (Rms), and the maximum height (Rmax) was 1.56 nm.

As a result of measuring an area of 1 μm×1 μm of the surface of the protective film according to Comparative Example 2 with an atomic force microscope, the bearing depth $BD_{30}$ for the bearing area of 30% ($BA_{30}$) was 0.725 nm. Further, the bearing depth $BD_{70}$ for the bearing area of 70% ($BA_{70}$) was 0.903 nm. Substituting those values in ($BA_{70}$-$BA_{30}$)/($BD_{70}$-$BD_{30}$) yielded (70−30)/(0.903−0.725)=225 (%/nm). Therefore, the surface roughness of the substrate with a multilayer reflective film according to Comparative Example 2 does not satisfy ($BA_{70}$-$BA_{30}$)/($BD_{70}$-$BD_{30}$)≥230 (%/nm), and maximum height (Rmax)≤1.5 nm.

Defect inspection of an area of 132 mm×132 mm at the surface of the protective film of the substrate with a multilayer reflective film 20 of Comparative Example 2 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the total number of defects detected including false defects exceeded 100,000, disabling inspection of the presence or absence of critical defects such as a foreign matter or scratches.

The same is true of the results of defect inspection of an area of 132 mm×132 mm at the surface of the protective film of Comparative Example 2 using the high-sensitivity defect inspection apparatus with an inspection light source wavelength of 13.5 nm; the total number of defects detected including false defects exceeded 100,000, disabling inspection of the presence or absence of critical defects. The reflective mask blank 30 and the reflective mask 40 were fabricated in the same manner as done in the above-described Comparative Example 1. Defect inspection of the obtained reflective mask 40 was performed using the high-sensitivity defect inspection apparatus (KLA-Tencor Corp. "Teron 600 Series"); although several tens of defects were observed, defect correction was performed with a defect correcting device to provide a reflective mask.

Example 4

Next, Example 4 for the mask blank substrate, the transmissive mask blank, and the transmissive mask for ArF excimer laser exposure according to the invention is described.
<Mask Blank Substrate>
In Example 4, a synthetic quartz glass substrate of the same size as those in Examples 1 to 3 were used, except for which the mask blank substrate 10 for ArF excimer laser exposure was fabricated through processes similar to those in the above-described <Fabrication of Mask Blank Substrate> of Example 2.

An area of 1 μm×1 μm at an arbitrary location in the transfer-pattern forming area (132 mm×132 mm) on the main surface of the mask blank substrate 10 for ArF excimer laser exposure provided by Example 4 was measured with an atomic force microscope; the root mean square roughness (Rms) was 0.11 nm, and the maximum height (Rmax) was 0.98 nm. The results of measuring the bearing curve of the main surface of the provided mask blank substrate 10 for ArF excimer laser exposure are shown by the thin dashed line for "Example 4" in the graph in FIG. 7.

As shown in the figure, as a result of measuring an area of 1 μm×1 μm of the main surface of the mask blank substrate 10 for ArF excimer laser exposure according to Example 4 with an atomic force microscope, the bearing depth $BD_{30}$ for the bearing area of 30% ($BA_{30}$) was 0.389 nm. Further, the bearing depth $BD_{70}$ for the bearing area of 70% ($BA_{70}$) was 0.500 nm. Substituting those values in ($BA_{70}$-$BA_{30}$)/($BD_{70}$-$BD_{30}$) yielded (70−30)/(0.500−0.389)=360 (%/nm). Therefore, the main surface of the mask blank substrate according to Example 4 satisfies ($BA_{70}$-$BA_{30}$)/($BD_{70}$-$BD_{30}$)≥350 (%/nm), and maximum height (Rmax)≤1.2 nm.

Although not illustrated, the bearing depth corresponding to the center of the FWHM and the bearing depth corresponding to ½ (half) of the maximum height (Rmax) of the main surface of the mask blank substrate of Example 4 were obtained from the frequency distribution plot of the relation between the bearing depth and the frequency thereof, with the same manner as Example 1; the bearing depth corresponding to the center of the FWHM was 0.44 nm, and the bearing depth corresponding to ½ (half) of the maximum height (Rmax) was 0.49 nm. Therefore, the main surface of the mask blank substrate according to Example 4 satisfied the condition that the absolute value of the bearing depth corresponding to the center of the FWHM should be smaller than the bearing depth corresponding to ½ (half) of the maximum height (Rmax).

Defect inspection of an area of 132 mm×132 mm at the main surface of the mask blank substrate 10 for ArF excimer laser exposure of Example 4 was performed using the high-sensitivity defect inspection apparatus ("Teron 600 series" of KLA-Tencor Corp.) with an inspection light source wavelength of 193 nm under the inspection sensitivity conditions that permit detection of defects of 20 nm or less in terms of SEVD (Sphere Equivalent Volume Diameter). As a result, the number of defects detected including false defects was a total of 31,056, showing that the false defects was significantly suppressed compared with the conventional number (more than 100,000) of detected defects. The total number of detected defects of about 31,056 can ensure that presence or absence of critical defects such as a foreign matter or scratches is easily inspected.
<Fabrication of Transmissive Mask Blank>
The above-described mask blank substrate 10 for ArF excimer laser exposure was set into a DC magnetron sputtering apparatus, and a TaO layer was deposited on the main surface of the mask blank substrate 10. A gas mixture of Xe+$N_2$ was supplied into the DC magnetron sputtering apparatus to perform sputtering using a Ta target. As a result, a TaN layer with a thickness of 44.9 nm was deposited on the main surface of the mask blank substrate 10.

Then, the gas in the DC magnetron sputtering apparatus was replaced with a mixture gas of Ar+$O_2$ to perform sputtering using a Ta target again. As a result, a TaO layer with a thickness of 13 nm was deposited on the surface of the TaN layer, providing a transmissive mask blank (binary mask blank) with a 2-layered light shielding function film 51 formed on the mask blank substrate 10.

Measurement of the crystal structure of the light shielding function film 51 showed that the crystal structure was an amorphous structure.

Defect inspection of an area of 132 mm×132 mm at the light shielding function film 51 on the mask blank substrate 10 of Example 4 was performed using the high-sensitivity defect inspection apparatus ("Teron 600 series" of KLA-Tencor Corp.) with an inspection light source wavelength of 193 nm. As a result, the number of defects detected including false defects was a total of 32,021, showing that the false defects was significantly suppressed compared with the conventional number (more than 100,000) of detected defects. The total number of detected defects of about 32,021 can ensure that presence or absence of critical defects such as a foreign matter or scratches is easily inspected.

<Fabrication of Transmissive Mask>

A resist was coated on the surface of the aforementioned light shielding function film 51 by spin coating, followed by heating and cooling processes, for forming a resist film 25 with a thickness of 150 nm through heating and cooling. Then, a resist pattern was formed through desired drawing and developing. With the resist pattern used as a mask, the TaO layer was patterned by dry etching with a fluorinated ($CHF_3$) gas, then the TaN layer was patterned by dry etching with a chlorine ($Cl_2$) gas, forming the light-shielding-function film pattern 61 on the mask blank substrate 10. Thereafter, the resist film 25 was removed, and the resultant structure was chemically cleaned in the above-described manner to fabricate the transmissive mask 60. Defection inspection of the provided transmissive mask 60 was performed using the high-sensitivity defect inspection apparatus ("Teron 600 series" of KLA-Tencor Corp.), resulting in observation of no defects.

Example 5

An $SiO_2$—$TiO_2$ glass substrate with a size of 152.4 mm×152.4 mm and a thickness of 6.35 mm was prepared as the mask blank substrate 10 for EUV exposure, and the top and bottom sides of the glass substrate were subjected to processes from polishing with the double-side polishing apparatus to the local surface treatment by magnetic viscoelastic fluid polishing, with the same manner as in Example 1.

Thereafter, as final polishing of the local surface treatment, double-sided touch polishing using colloidal silica abrasive was carried out for the purpose of improving the surface roughness, and then a surface treatment by catalyst-referred etching (CARE) was carried out under the following processing conditions.

working fluid: pure water
catalyst: platinum
rotational speed of the substrate: 10.3 rotations/min
rotational speed of the catalyst: 10 rotations/min
processing time: 50 minutes
processing pressure: 250 hPa Then, after scrubbing the end faces of the glass substrate, the substrate was immersed in a cleaning tank containing aqua regia (temperature of about 65° C.) for about 10 minutes, after which the substrate was rinsed with pure water, followed by drying. It is noted that washing with aqua regia was performed multiple times until the top and bottom sides of the glass substrate were free of the residue of platinum serving as the catalyst.

An area of 1 µm×1 µm at an arbitrary location in the transfer-pattern forming area (132 mm×132 mm) on the main surface of the mask blank substrate 10 for EUV exposure provided by Example 5 was measured with an atomic force microscope; the root mean square roughness (Rms) was 0.040 nm, and the maximum height (Rmax) was 0.40 nm.

The results of measuring the bearing curve of the main surface of the provided mask blank substrate 10 according to Example 5 are shown in FIG. 10(a).

Referring to the figure, as a result of measuring an area of 1 µm×1 µm of the main surface of the mask blank substrate 10 for EUV exposure according to Example 5 with an atomic force microscope, the bearing depth $BD_{30}$ for the bearing area of 30% ($BA_{30}$) was 0.135 nm. Further, the bearing depth $BD_{70}$ for the bearing area of 70% ($BA_{70}$) was 0.177 nm. Substituting those values in ($BA_{70}$–$BA_{30}$)/($BD_{70}$–$BD_{30}$) yielded (70–30)/(0.177–0.135)=952 (%/nm). Therefore, the main surface of the mask blank substrate 10 according to Example 5 satisfies ($BA_{70}$–$BA_{30}$)/($BD_{70}$–$BD_{30}$)≥230 (%/nm), and maximum height (Rmax)≤1.5 nm.

The bearing depth corresponding to the center of the FWHM and the bearing depth corresponding to ½ (half) of the maximum height (Rmax) of the main surface of the mask blank substrate of Example 5 were obtained from the frequency distribution in FIG. 10(b); the bearing depth corresponding to the center of the FWHM was 0.157 nm, and the bearing depth corresponding to ½ (half) of the maximum height (Rmax) was 0.20 nm. Therefore, the main surface of the mask blank substrate according to Example 5 satisfied the condition that the absolute value of the bearing depth corresponding to the center of the FWHM should be smaller than the bearing depth corresponding to ½ (half) of the maximum height (Rmax).

Defect inspection of an area of 132 mm×132 mm at the main surface of the mask blank substrate 10 for EUV exposure of Example 5 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 370, showing that the false defects was significantly suppressed compared with the conventional number (more than 100,000) of detected defects. The total number of detected defects of about 370 can ensure that presence or absence of critical defects such as a foreign matter or scratches is easily inspected.

<Fabrication of Substrate with Multilayer Reflective Film>

The multilayer reflective film 21 with a thickness 280 nm having Si films and Mo films alternately laminated as done in Example 1 was formed on the main surface of the aforementioned mask blank substrate 10 of the EUV exposure, and the protective film 22 of Ru with a thickness of 2.5 nm was deposited on the surface of the multilayer reflective film 21. The ion beam sputtering conditions for the multilayer reflective film 21 were the same as those in Example 1.

With regard to the surface of the protective film of the provided substrate with a multilayer reflective film, an area of 1 µm×1 µm at an arbitrary location in the transfer-pattern forming area (132 mm×132 mm) was measured with an atomic force microscope; the surface roughness was 0.135 nm in terms of the root mean square roughness (Rms), and the maximum roughness (Rmax) was 1.27 nm.

As a result of measuring an area of 1 µm×1 µm of the surface of the protective film according to Example 5 with an atomic force microscope, the bearing depth $BD_{30}$ for the bearing area of 30% ($BA_{30}$) was 0.575 nm. Further, the bearing depth $BD_{70}$ for the bearing area of 70% ($BA_{70}$) was 0.733 nm. Substituting those values in ($BA_{70}$–$BA_{30}$)/($BD_{70}$–$BD_{30}$) yielded (70–30)/(0.733–0.575)=253 (%/nm). Therefore, the main surface of the substrate with a multilayer reflective film according to Example 5 satisfies ($BA_{70}$–$BA_{30}$)/($BD_{70}$–$BD_{30}$) ≥230 (%/nm), and maximum height (Rmax)≤1.5 nm.

Defect inspection of an area of 132 mm×132 mm at the surface of the protective film of the substrate with a multilayer reflective film 20 of Example 5 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 13,512, showing that the false defects was significantly suppressed compared with the conventional number (more than 100,000) of detected defects.

Further, defect inspection of an area of 132 mm×132 mm at the surface of the protective film of Example 5 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, enabling inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD (Sphere Equivalent Volume Diameter) of not more than 20 nm.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

Example 6

Fabrication of Substrate with Multilayer Reflective Film

A substrate with a multilayer reflective film was fabricated in the same manner as done in the above-described Example 5 except for that deposition was carried out by ion beam sputtering with the deposition conditions for the multilayer reflective film 21 such that the incident angle of sputtered particles for the Si film to the normal line of the main surface of the substrate was 30 degrees, and the incident angle of sputtered particles for the Mo films thereto was 30 degrees.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.116 nm in terms of the root mean square roughness (Rms), and the maximum roughness (Rmax) was 1.15 nm.

As a result of measuring an area of 1 μm×1 μm of the surface of the protective film according to Example 6 with an atomic force microscope, the bearing depth $BD_{30}$ for the bearing area of 30% ($BA_{30}$) was 0.622 nm. Further, the bearing depth $BD_{70}$ for the bearing area of 70% ($BA_{70}$) was 0.753 nm. Substituting those values in $(BA_{70}-BA_{30})/(BD_{70}-BD_{30})$ yielded (70−30)/(0.753−0.622)=305 (%/nm). Therefore, the main surface of the substrate with a multilayer reflective film according to Example 6 satisfies $(BA_{70}-BA_{30})/(BD_{70}-BD_{30})$ ≥230 (%/nm), and maximum height (Rmax)≤1.5 nm.

Defect inspection of an area of 132 mm×132 mm at the surface of the protective film of the substrate with a multilayer reflective film 20 of Example 6 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 4,768, showing that the false defects was significantly suppressed compared with the conventional number (more than 100,000) of detected defects.

Further, defect inspection of an area of 132 mm×132 mm at the surface of the protective film of Example 6 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, enabling inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD (Sphere Equivalent Volume Diameter) of not more than 20 nm.

The reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

Example 7

The multilayer reflective film 21 and the protective film 22 were formed on the mask blank substrate for EUV exposure according to Comparative Example 1 with the deposition conditions (the incident angle of sputtered particles for the Si film to the normal line of the main surface of the substrate was 30 degrees, and the incident angle of sputtered particles for the Mo films thereto was 30 degrees) of the above-described Example 6, thereby fabricating a substrate with a multilayer reflective film.

With regard to the surface of the protective film of the provided substrate with a multilayer reflective film, an area of 1 μm×1 μm at an arbitrary location in the transfer-pattern forming area (132 mm×132 mm) was measured with an atomic force microscope; the surface roughness was 0.122 nm in terms of the root mean square roughness (Rms), and the maximum roughness (Rmax) was 1.32 nm.

As a result of measuring an area of 1 μm×1 μm of the surface of the protective film according to Example 7 with an atomic force microscope, the bearing depth $BD_{30}$ for the bearing area of 30% ($BA_{30}$) was 0.820 nm. Further, the bearing depth $BD_{70}$ for the bearing area of 70% ($BA_{70}$) was 0.967 nm. Substituting those values in $(BA_{70}-BA_{30})/(BD_{70}-BD_{30})$ yielded (70−30)/(0.967−0.820)=272 (%/nm). Therefore, the main surface of the substrate with a multilayer reflective film according to Example 7 satisfies $(BA_{70}-BA_{30})/(BD_{70}-BD_{30})$ ≥230 (%/nm), and maximum height (Rmax)≤1.5 nm.

Defect inspection of an area of 132 mm×132 mm at the surface of the protective film of the substrate with a multilayer reflective film 20 of Example 7 was performed under the inspection sensitivity conditions that permit detection of defects of not more than 20 nm in terms of SEVD (Sphere Equivalent Volume Diameter) using the high-sensitivity defect inspection apparatus ("Teron 600 series" of KLA-Tencor Corp.) with an inspection light source wavelength of 193 nm. As a result, the number of defects detected including false defects was a total of 10,218, showing that the false defects was significantly suppressed compared with the conventional number (more than 100,000) of detected defects. The reflectance to EUV light was measured, showing a good result of 65%.

Further, defect inspection of an area of 132 mm×132 mm at the surface of the multilayer reflective film of Example 7 was performed using the high-sensitivity defect inspection apparatus ("MAGICS M7360" of Lasertec Corp.) with an inspection light source wavelength of 266 nm and the high-sensitivity defect inspection apparatus with an inspection light source wavelength of 13.5 nm. As a result, the total number of detected defects in each detection was less than 100,000, enabling inspection of critical defects. It is noted that defect inspection was performed under the best inspection sensitivity conditions using the high-sensitivity defect inspection apparatus ("MAGICS M7360" of Lasertec Corp.) with an inspection light source wavelength of 266 nm, and defect inspection was performed using the high-sensitivity defect inspection apparatus with an inspection light source wavelength of 13.5 nm under the inspection sensitivity conditions that permit detection of defects with the SEVD (Sphere Equivalent Volume Diameter) of not more than 20 nm.

Further, the reflective mask blank 30 and the reflective mask 40 were fabricated in the same manner as done in the above-described Example 1. Defect inspection of the obtained reflective mask 40 was performed using the high-sensitivity defect inspection apparatus (KLA-Tencor Corp. "Teron 600 Series"); no defects were observed.

<Method of Manufacturing Semiconductor Device>

Next, pattern transfer onto resist films on transferred substrates of semiconductor substrates with an exposure apparatus using the reflective masks and the transmissive masks according to the above-described Examples 1 to 7 and Comparative Examples 1 and 2 was performed. After that, an interconnection layer was patterned to fabricate semiconductor devices. As a result, when the reflective masks and the transmissive masks according to the above-described Examples 1 to 7 were used, the semiconductor devices could be fabricated without pattern defects, whereas when the reflective masks and the transmissive masks according to the above-described Comparative Examples 1 and 2 were used, pattern defects occurred, which resulted in defective semiconductor devices. This is because critical defects were buried in false defects and could not be detected in defect inspection on the mask blank substrate, the substrate with a multilayer reflective film, the reflective mask blank and reflective mask, which resulted in improper drawing correction and improper mask correction, so that the reflective mask contained critical defects.

In the fabrication of the above-described substrate with a multilayer reflective film 20 and the reflective mask blank 30, the multilayer reflective film 21 and the protective film 22 were deposited on the main surface on that side of the mask blank substrate 10 where a transfer pattern is formed, after which the back-side conductive film 23 is formed on the bottom side opposite to that main surface, which is not restrictive. The reflective mask blank 30 may be fabricated by forming the back-side conductive film 23 on the main surface of the mask blank substrate 10 opposite to the side where a transfer pattern is formed, and then depositing the multilayer reflective film 21 and further the protective film 22 on the main surface on the side where the transfer pattern is formed.

According to the above-described Examples, the bearing depths $BD_M$, $BD_m$ corresponding to the center of the full width at half maximum are obtained from the value of the maximum frequency $f_{max}$ at plotted points in the frequency distribution, which is not restrictive. The maximum frequency $f_{max}$ may be obtained from an approximation curve obtained from the points plotted by the frequency distribution to obtain the bearing depths corresponding to the full width at half maximum.

DESCRIPTION OF REFERENCE NUMERALS

10 a mask blank substrate
20 a substrate with a multilayer reflective film
21 a multilayer reflective film
22 a protective film
23 a back-side conductive film
24 an absorber film
27 an absorber pattern
30 a reflective mask blank
40 a reflective mask
50 a transmissive mask blank
51 a light shielding function film
60 a transmissive mask

The invention claimed is:

1. A mask blank substrate for use in lithography, wherein a main surface of the substrate satisfies a relational equation of $(BA_{70}-BA_{30})/(BD_{70}-BD_{30}) \geq 350$ (%/nm), and has a maximum height (Rmax)≤1.2 nm in a relation between a bearing area (%) and a bearing depth (nm) obtained by measuring, with an atomic force microscope, an area of 1 μm×1 μm in the main surface on the side of the substrate where a transfer pattern is formed, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

2. The mask blank substrate according to claim 1, wherein the main surface is a surface such that, in a frequency distribution plotting a relation between the bearing depth, measured with the atomic force microscope, and a frequency (%) of the obtained bearing depth, the absolute value of the bearing depth corresponding to the center of a half-value width obtained from an approximation curve obtained by the plotted points or the highest frequency at the plotted points is smaller than the absolute value of the bearing depth corresponding to ½ of a maximum height (Rmax) of the surface roughness of the main surface of the substrate.

3. The mask blank substrate according to claim 1 wherein the main surface is subjected to a surface treatment with catalyst-referred etching.

4. The mask blank substrate according to claim 1, wherein the mask blank substrate is used in EUV lithography.

5. The mask blank substrate according to claim 4, wherein a thin film of a material comprising a metal, an alloy, or at least one of oxygen, nitrogen and carbon contained in one of the metal and the alloy, is formed on the main surface of a substrate of multi-component glass.

6. A substrate with a multilayer reflective film comprising a multilayer reflective film having a high refractive index layer and a low refractive index layer alternately laminated on the main surface of the mask blank substrate according to claim 1.

7. The substrate with a multilayer reflective film according to claim 6, wherein the substrate with a multilayer reflective film has a protective film on the multilayer reflective film.

8. A reflective mask blank comprising an absorber film to be a transfer pattern on the protective film of the substrate with a multilayer reflective film according to claim 7.

9. A transmissive mask blank comprising a light shielding function film to be a transfer pattern on the main surface of the mask blank substrate according to claim 1.

10. A transmissive mask comprising a light shielding function film pattern provided on the main surface by patterning the light shielding function film of the transmissive mask blank according to claim 9.

11. A method of manufacturing a semiconductor device, comprising a step of forming a transfer pattern on a transferred substrate using the transmissive mask according to claim 10 by performing a lithography process using an exposure device.

12. A substrate with a multilayer reflective film for use in lithography, the substrate with a multilayer reflective film having a high refractive index layer and a low refractive index layer alternately laminated on the main surface of the mask blank substrate, wherein a main surface of the substrate satisfies a relational equation of $(BA_{70}-BA_{30})/(BD_{70}-BD_{30}) \geq 230$ (%/nm), and has a maximum height (Rmax)$\leq$1.5 nm in a relation between a bearing area (%) and a bearing depth (nm) obtained by measuring, with an atomic force microscope, an area of 1 μm×1 μm in the main surface on the side of the substrate where a transfer pattern is formed, wherein $BA_{30}$ is defined as a bearing area of 30%, $BA_{70}$ is defined as a bearing area of 70%, and $BD_{70}$ and $BD_{30}$ are defined to respectively represent bearing depths for the bearing area of 30% and the bearing area of 70%.

13. A reflective mask blank comprising an absorber film to be a transfer pattern on the multilayer reflective film of the substrate with a multilayer reflective film according to claim 12.

14. A reflective mask comprising an absorber pattern provided on the multilayer reflective film by patterning the absorber film of the reflective mask blank according to claim 13.

15. A method of manufacturing a semiconductor device, comprising a step of forming a transfer pattern on a transferred substrate using the reflective mask according to claim 14 by performing a lithography process using an exposure device.

* * * * *